US006917078B2

(12) United States Patent
Bhattacharyya

(10) Patent No.: US 6,917,078 B2
(45) Date of Patent: *Jul. 12, 2005

(54) ONE TRANSISTOR SOI NON-VOLATILE RANDOM ACCESS MEMORY CELL

(75) Inventor: Arup Bhattacharyya, Essex Junction, VT (US)

(73) Assignee: Micron Technology Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/232,846

(22) Filed: Aug. 30, 2002

(65) Prior Publication Data

US 2004/0041208 A1 Mar. 4, 2004

(51) Int. Cl.[7] .............................................. H01L 27/01
(52) U.S. Cl. ........................ 257/347; 257/348; 257/350; 257/351
(58) Field of Search ................................ 257/347–354, 257/324

(56) References Cited

U.S. PATENT DOCUMENTS

| | | | | |
|---|---|---|---|---|
| 3,918,033 A | | 11/1975 | Case et al. ................. | 365/180 |
| 3,964,085 A | | 6/1976 | Kahng et al. ............... | 428/428 |
| 3,978,577 A | | 9/1976 | Bhattacharyya et al. ...... | 29/571 |
| 4,488,262 A | | 12/1984 | Basire et al. ............... | 365/104 |
| 4,791,604 A | | 12/1988 | Lienau et al. .................. | 365/9 |
| 4,829,482 A | | 5/1989 | Owen ..................... | 365/189.09 |
| 4,870,470 A | | 9/1989 | Bass, Jr. et al. ............ | 357/23.5 |
| 5,043,946 A | | 8/1991 | Yamauchi et al. ..... | 365/185.08 |
| 5,396,454 A | | 3/1995 | Nowak ........................ | 365/154 |
| 5,488,243 A | * | 1/1996 | Tsuruta et al. .............. | 257/314 |
| 5,557,569 A | | 9/1996 | Smayling et al. ...... | 365/185.28 |
| 5,621,683 A | | 4/1997 | Young ................... | 365/185.05 |
| 5,627,779 A | | 5/1997 | Odake et al. ........... | 365/185.01 |
| 5,801,993 A | | 9/1998 | Choi ..................... | 365/185.28 |
| 5,814,853 A | | 9/1998 | Chen .......................... | 257/315 |

(Continued)

FOREIGN PATENT DOCUMENTS

JP            61-166078         7/1986      ........... H01L/29/78

OTHER PUBLICATIONS

Bhattacharyya, A., "Physical & Electrical Characteristics of LPCVD Silicon Rich Nitride", *ECS Technical Digest, J. Eletrochem. Soc., 131(11)*, 691 RDP, New Orleans,(1984), 469C.

Frohman–Bentchkowsky, D, et al., "An integrated metal–nitride–oxide–silicon (MNOS) memory", *Proceedings of the IEEE, 57(6)*, (Jun. 1969), 1190–1192.

Ohsawa, T, "Memory design using one–transistor gain cell on SOI", *IEEE International Solid–State Circuits Conference. Digest of Technical Papers, vol. 1*, (2002),152–455.

Okhonin, S, "A SOI capacitor–less 1T–DRAM concept", *2001 IEEE International SOI Conference, Proceedings, IEEE. 2001.* (2000), 153–4.

(Continued)

*Primary Examiner*—Thien F Tran
(74) *Attorney, Agent, or Firm*—Schwegman, Lundberg, Woessner & Kluth, P.A.

(57) ABSTRACT

One aspect of the present subject matter relates to a memory cell, or more specifically, to a one-transistor SOI non-volatile memory cell. In various embodiments, the memory cell includes a substrate, a buried insulator layer formed on the substrate, and a transistor formed on the buried insulator layer. The transistor includes a floating body region that includes a charge trapping material. A memory state of the memory cell is determined by trapped charges or neutralized charges in the charge trapping material. The transistor further includes a first diffusion region and a second diffusion region to provide a channel region in the body region between the first diffusion region and the second diffusion region. The transistor further includes a gate insulator layer formed over the channel region, and a gate formed over the gate insulator layer. Other aspects are provided herein.

68 Claims, 19 Drawing Sheets

U.S. PATENT DOCUMENTS

| | | | |
|---|---|---|---|
| 5,963,476 A | 10/1999 | Hung et al. | 365/185.22 |
| 5,981,335 A | 11/1999 | Chi | 438/253 |
| 6,104,045 A | 8/2000 | Forbes et al. | 257/141 |
| 6,201,734 B1 | 3/2001 | Sansbury et al. | 365/185.1 |
| 6,243,296 B1 | 6/2001 | Sansbury | 365/185.18 |
| 6,248,626 B1 * | 6/2001 | Kumar et al. | 438/257 |
| 6,294,427 B1 | 9/2001 | Furuhata et al. | 438/257 |
| 6,462,359 B1 | 10/2002 | Nemati et al. | 257/107 |
| 6,545,297 B1 | 4/2003 | Noble et al. | 257/124 |
| 6,574,143 B2 | 6/2003 | Nakazato | 365/185.18 |
| 6,600,188 B1 | 7/2003 | Jiang et al. | 257/296 |
| 6,638,627 B2 | 10/2003 | Potter | 428/446 |
| 6,653,174 B1 | 11/2003 | Cho | 438/133 |
| 6,653,175 B1 | 11/2003 | Nemati et al. | 438/133 |
| 2002/0048190 A1 | 4/2002 | King | 365/185.18 |
| 2002/0105023 A1 | 8/2002 | Kuo et al. | 257/318 |
| 2003/0042534 A1 | 3/2003 | Bhattacharyya et al. | 257/317 |
| 2003/0072126 A1 | 4/2003 | Bhattacharyya | 361/311 |
| 2003/0089942 A1 | 5/2003 | Bhattacharyya | 257/310 |
| 2003/0151948 A1 | 8/2003 | Bhattacharyya et al. | 365/185.18 |
| 2003/0160277 A1 | 8/2003 | Bhattacharyya et al. | 257/503 |
| 2004/0007734 A1 | 1/2004 | Kato et al. | 257/324 |
| 2004/0014304 A1 | 1/2004 | Bhattacharyya | 438/570 |
| 2004/0041206 A1 * | 3/2004 | Bhattacharyya | 257/326 |

OTHER PUBLICATIONS

Bauer, F, et al., "Design aspects of MOS controlled thyristor elements", *International Electron Devices Meeting 1989. Technical Digest,* (1989), 297–300.

Carter, R J., "Electrical Characterization of High–k Materials Prepared By Atomic Layer CVD", *IWGI,* (2001),94–99.

Chang, H R., et al., "MOS trench gate field–controlled thyristor", *Technical Digest –International Electron Devices Meeting,* (1989),293–296.

Choi, J D., et al., "A 0.15 $\mu$m NAND Flash Technology with 0.11 $\mu m^2$ Cell Size for 1 Gbit Flash Memory", *IEDM Technical Digest,* (2000),767–770.

Fazan, P, et al., "Capacitor–Less 1–Transistor DRAM", *IEEE International SOI Conference,* (2002),10–13.

Han, Kwangseok, "Characteristics of P–Channel Si Nano–Crystal Memory", *IEDM Technical Digest, International Electron Devices Meeting,* (Dec. 10–13, 2000),309–312.

Jagar, S, "Single grain thin–film–transistor (TFT) with SOI CMOS performance formed by metal–induced–lateral–crystallization", *International Electron Devices Meeting 1999, Technical Digest,* (1999),293–6.

Kumar, M. J., "Lateral Schottky Rectifiers for Power Integrated Circuits", *International Workshop on the Physics of Semiconductor Devices,11th, 4746,* Allied Publishers Ltd., New Delhi, India,(2002),414–421.

Lai, S K., et al., "Comparison and trends in Today's dominant $E^2$ Technologies", *IEDM Technical Digest,* (1986), 580–583.

Nemati, F. et al., "A Novel High Density, Low Voltage SRAM Cell With a Vertical NDR device", *1998 Symposium on VLSI Technology Digest of Technical Papers,* (1998), 66–7.

Nemati, F, et al., "A Novel Thyristor–based SRAM Cell (T–RAM) for High–Speed, Low–Voltage, Giga–scale Memories", *International Electron Devices Meeting 1999, Technical Digest,* (1999),283–6.

Shinohe, T, et al., "Ultra–high di/dt 2500 V MOS assisted gate–triggered thyristors (MAGTs) for high repetition excimer laser system", *International Electron Devices Meeting 1989, Technical Digest,* (1989),301–4.

Sze, S. M., "Table 3: Measured Schottky Barrier Heights (Volts at 300 K)", *In: Physics of Semiconductor Devices,* John Wiley & Sons, Inc.,(1981),p. 291.

Tiwari, Sandip, "Volatile and Non–Volatile Memories in Silicon with Nano–Crystal Storage", *Int'l Electron Devices Meeting: Technical Digest,* Washington, DC,(Dec. 1995), 521–524.

Van Meer, H, "Ultra–Thin Film Fully–Depleted SOI CMOS with Raised G/S/D Device Architecture for Sub–100 nm Applications", *2001 IEEE International SOI Conference,* (2001),45–6.

Zhang, H., "Atomic Layer Deposition of High Dielectric Constant Nanolaminates", *Journal of The Electrochemical Society, 148(4),* (Apr. 2001),F63–F66.

* cited by examiner

HOLE　　　ELECTRON - HOLE
DETRAPPING　CHARGE NEUTRALIZATION

ONE TRANSISTOR SOI NON-VOLATILE RANDOM ACCESS MEMORY CELL

CROSS REFERENCE TO RELATED APPLICATIONS

This application is related to the following commonly assigned U.S. patent applications which are herein incorporated by reference in their entirety: "Scalable Flash/NV Structures & Devices With Enhanced Endurance," U.S. application Ser. No. 09/944,985, filed on Aug. 30, 2001; "Stable PD-SOI Devices and Methods," U.S. application Ser. No. 10/197,978, filed on Jul. 18, 2002; "Gated Lateral Thyristor-Based Random Access Memory Cell (GLTRAM)," U.S. application Ser. No. 10/232,855, filed on Aug. 30, 2002; and "One-Device Non-Volatile Random Access Memory Cell," U.S. application Ser. No. 10/232,848, filed on Aug. 30, 2002.

TECHNICAL FIELD

This disclosure relates generally to integrated circuits, and more particularly, to non-volatile, silicon-on-insulator (SOI) memory cells.

BACKGROUND

Known dynamic random access memory (DRAM) devices include a switching transistor and an integrated storage capacitor tied to the storage node of the transistor. Incorporating a stacked capacitor or a trench capacitor in parallel with the depletion capacitance of the floating storage node enhances charge storage. Due to a finite charge leakage across the depletion layer, the capacitor is frequently recharged or refreshed to ensure data integrity in the DRAM device. Thus, such a DRAM device is volatile. A power failure causes permanent data loss in a DRAM device. DRAM devices are relatively inexpensive, power efficient, and fast compared to non-volatile random access memory (NVRAM) devices.

A minimum capacitance per cell is required to sense a conventional DRAM cell. A significant challenge for every succeeding generation of reduced feature size is to provide this minimum capacitance per cell. A memory cell design goal is to achieve an $8F^2$ DRAM cell. To that end, complex three-dimensional capacitor structures have been designed. However, these complex three-dimensional capacitor structures are difficult to manufacture and adversely impact yield. There has been serious concern of the scalability of the conventional DRAM cell beyond the 0.1 $\mu$m lithographic generation. The scaling problems have been aggravated by increased device short channel effects and leakages associated with complicated capacitor structures. Thus, the elimination of the stacked capacitor or trench capacitor in a DRAM cell is desirable.

A silicon-on-insulator (SOI) capacitor-less single-transistor DRAM cell has been proposed by S. Okhonin et al. The state of the floating body charge in the transistor affects the channel conductance of the transistor and defines the memory state ("1" or "0") of the cell. Two methods for generating carriers in the body were proposed. The generated carriers are holes for the partially depleted (PD) SOI-NFET or electrons for the PD-SOI-PFET. One proposed method generates carriers using the drain-edge high field effect associated with impact ionization. In another case, the carriers are generated by the parasitic bipolar phenomenon.

The memory retention for these SOI capacitor-less single-transistor DRAM cells depends on the device channel length. That is, the stored charge retention time decreases with decreasing channel length. Additionally, the memory retention depends on recombination charge constants and multiple recombination mechanisms, and thus is expected to be both temperature and process sensitive. Therefore, controlling the memory retention between refresh operations is expected to be difficult.

Known non-volatile random access memory (NVRAM), such as Flash, EPROM, EEPROM, etc., store charge using a floating gate or a floating plate. Charge trapping centers and associated potential wells are created by forming nano-particles of metals or semiconductors in a large band gap insulating matrix, or by forming nano-layers of metal, semiconductor or a small band gap insulator that interface with one or more large band gap insulating layers. The floating plate or gate can be formed as an integral part of the gate insulator stack of the switching transistor.

Field emission across the surrounding insulator causes the stored charge to leak. The stored charge leakage from the floating plate or floating gate is negligible for non-volatile memory devices because of the high band gap insulator. For example, silicon dioxide ($SiO_2$) has a 9 ev band gap, and oxide-nitride-oxide (ONO) and other insulators have a band gap in the range of 4.5 ev to 9 ev. Thus, the memory device retains stored data throughout a device's lifetime.

However, there are problems associated with NVRAM devices. The writing process, also referred to as "write-erase programming," for non-volatile memory is slow and energy inefficient, and requires complex high voltage circuitry for generating and routing high voltage. Additionally, the write-erase programming for non-volatile memory involves high-field phenomena (hot carrier or field emission) that degrades the surrounding insulator. The degradation of the insulator eventually causes significant leakage of the stored charge. Thus, the high-field phenomena negatively affects the endurance (the number of write/erase cycles) of the NVRAM devices. The number of cycles of writing and erasing is typically limited to 1 E6 cycles. Therefore, the available applications for these known NVRAM devices is limited.

Floating plate non-volatile memory devices have been designed that use a gate insulator stack with silicon-rich insulators. In these devices, injected charges (electrons or holes) are trapped and retained in local quantum wells provided by nano-particles of silicon embedded in a matrix of a high band gap insulator (also referred to as a "trapless" or "limited trap" insulator) such as silicon dioxide ($SiO_2$) or silicon nitride ($Si_3N_4$). In addition to silicon trapping centers, other trapping centers include tungsten particles embedded in $SiO_2$, gold particles embedded in $SiO_2$, and a tungsten oxide layer embedded in $SiO_2$.

There is a need in the art to provide dense and high speed capacitor-less memory cells with data non-volatility similar to Flash devices and DRAM-like endurance as provided by the present subject matter.

SUMMARY

The above mentioned problems are addressed by the present subject matter and will be understood by reading and studying the following specification. The present subject matter relates to non-volatile memory cells. In various embodiments, the memory cells are formed using one transistor. In various embodiments, the memory cell transistor is a partially-depleted SOI field effect transistor (PD-SOI-FET) transistor with a floating body that contains charge traps.

The present subject matter provides a binary memory state by trapping charges in the floating body to provide a first state and by neutralizing and/or de-trapping the trapped charges in the floating body to provide a second state. Both states are stable to provide non-volatility. Various embodiments provide a charge trapping region in the body of the transistor near the interface between the transistor body and the buried insulator, such as buried oxide (BOX). Various embodiments provide a charge trapping layer, such as a silicon-rich-nitride (SRN) layer, near the BOX-body interface. The charges are neutralized by providing charges of opposite polarity into the transistor body. Charge retention is independent with respect to the device body length. The memory cell of the present subject matter is capable of long charge retention and non-volatility. Additionally, the memory cell of the present subject matter provides high density ($4F^2$) and fast DRAM-like read-write capabilities.

One aspect of the present subject matter relates to a memory cell. In various embodiments, the memory cell includes a substrate, a buried insulator layer formed on the substrate, and a transistor formed on the buried insulator layer. The transistor includes a floating body region that includes a charge trapping material (or charge trapping region). A memory state of the memory cell is determined by trapped charges or neutralized charges in the charge trapping material. The transistor further includes a first diffusion region and a second diffusion region to provide a channel region in the body region between the first diffusion region and the second diffusion region. The transistor further includes a gate insulator layer formed over the channel region, and a gate formed over the gate insulator layer.

These and other aspects, embodiments, advantages, and features will become apparent from the following description of the present subject matter and the referenced drawings.

DETAILED DESCRIPTION

Figure 1:
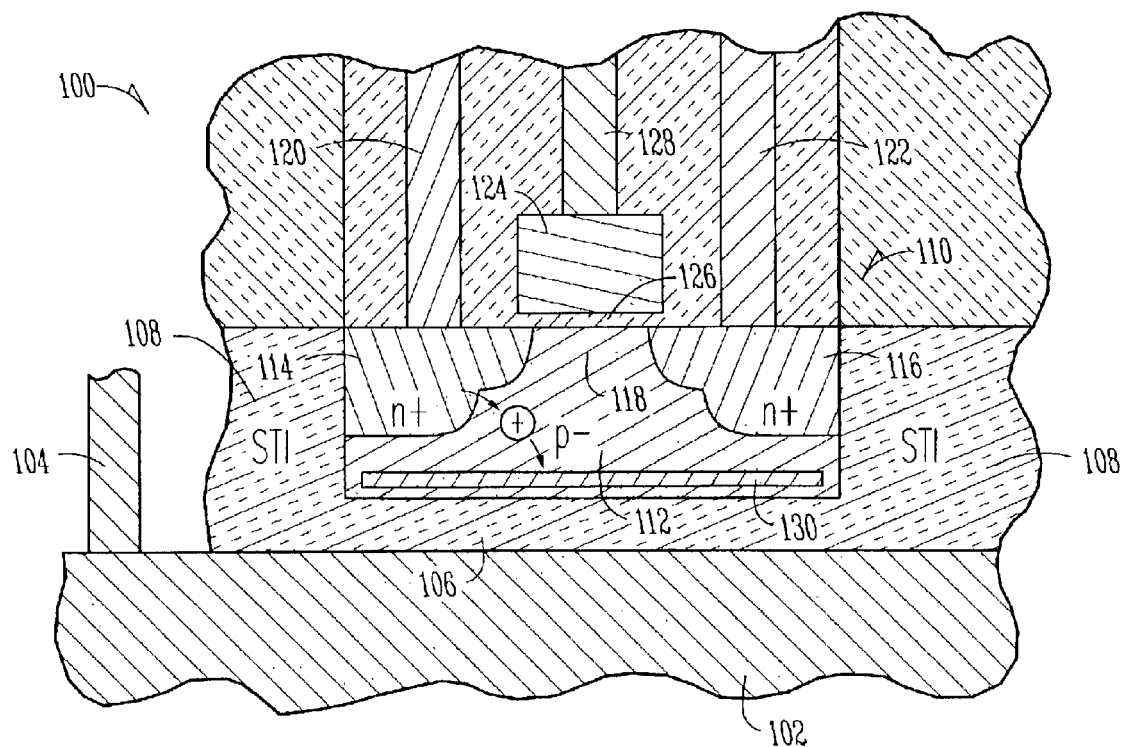
FIG. 1 illustrates an n-channel one transistor SOI non-volatile memory cell according to various embodiments of the present subject matter.

The following detailed description refers to the accompanying drawings which show, by way of illustration, specific aspects and embodiments in which the present subject matter may be practiced. These embodiments are described in sufficient detail to enable those skilled in the art to practice the present subject matter. The various embodiments of the present subject matter are not necessarily mutually exclusive. Other embodiments may be utilized and structural, logical, and electrical changes may be made without departing from the scope of the present subject matter. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in sidewall), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

The present subject matter relates to a one transistor, non-volatile memory cell. The memory cell is formed using silicon-on-insulator (SOI) technology. In various embodiments, the memory cell transistor is a partially-depleted SOI field effect transistor (PD-SOI-FET) with a floating body that contains charge traps. However, various embodiments of the present subject matter include other floating body transistors.

The one transistor SOI memory cell of the present subject matter achieves high density ($4F^2$), has fast DRAM-like read/write capabilities, and has high-retention and non-volatility. A binary yet stable memory state is provided by trapping charges in the floating body of the PD-SOI transistor, and by neutralizing (or discharging) the charges trapped in the floating body. In various embodiments, the trapped charge is neutralized by injecting charge of opposite polarity into the body. The state of the memory cell is read by sensing the channel conductance of the cell transistor to determine if the cell transistor is in a charged state or a neutralized state, which can be defined as a logic or memory state "1", and a logic or memory state "0". For example, the memory cell state is determined by sensing the change in the device current that is associated with the trapped stored-charge.

The present subject matter generates carriers in a floating body of the PD-SOI transistor, and traps the carriers in the floating body using charge traps. The binary memory state is provided by trapping charges in the floating body and by neutralizing the trapped charge in the floating body. In various embodiments, the charge traps are provided by a charge trapping layer in the floating body. According to various embodiments, the charge trapping layer includes silicon-rich-nitride (SRN). The trapped carriers are neutralized by generating and injecting charges of opposite polarity.

According to various embodiments, the memory cell provides an energy barrier for the stored charge in the order of 1 ev or less. Thus, for various embodiments, the memory cell is capable of having long charge retention for both the charged state and the neutralized state. The charge retention is independent of the channel length. This long charge retention provides the memory cell with a non-volatile characteristic. The degree of non-volatility can be altered by altering the trapping material and thereby modifying the energy barrier (trapped energy depth). Therefore, various embodiments have an appropriate trapping material to provide a non-volatile random access memory, and various embodiments have an appropriate trapping material to provide a non-volatile write once, read only memory.

Those of ordinary skill in the art will appreciate, upon reading and understanding this disclosure, that the present subject matter provides a number of benefits. These benefits include inexpensive and dense memories. The memory cell ($4F^2$) of the present invention is twice as dense as a conventional DRAM ($8F^2$). Another benefit is non-volatility, thus eliminating the need to refresh the state of the memory cell. Another benefit of the present subject matter is that the memory cell of the present subject matter is energy efficient. Another benefit is that the present subject matter provides DRAM-like endurance within a non-volatile memory cell because the non-volatile memory cell of the present subject matter is capable of undergoing a large number of write/erase cycles.

Memory Cell Structure

FIG. 1 illustrates an n-channel one transistor SOI non-volatile memory cell according to various embodiments of the present subject matter. The memory cell 100 is formed on a substrate 102, such as a silicon substrate, for example. The illustration includes a substrate contact 104 to contact the substrate 102. The memory cell 100 is isolated from the substrate 102 via a buried insulator, such as a buried oxide (BOX) layer 106, and from other devices via shallow trench isolation (STI) regions 108.

A PD-SOI NFET 110 is illustrated. The transistor 110 includes a floating body region 112, a first diffusion region 114, and a second diffusion region 116. A channel region 118 is formed in the body region 112 between the first and second diffusion regions 114 and 116. With respect to the illustrated n-channel FET, the body region 112 is doped with p-type impurities, and the first and second diffusion regions 114 and 116 are doped with n+ impurities. The illustrated memory cell 100 includes a bit line contact or drain contact 120 connected to the first diffusion region 114, and a source line contact 122 connected to the second diffusion region 116. A gate 124, such as a polysilicon gate, is separated from the channel region 118 by a gate insulator region 126. The illustrated memory cell 100 includes a word line contact or gate contact 128 connected to the gate 124.

Unlike conventional FET devices, the body region 112 of the illustrated FET device includes a charge trapping region 130. Relatively simple fabrication techniques can be used to incorporate the charge trapping region in the body region. However, as one of ordinary skill in the art will understand upon reading and comprehending this disclosure, the incorporation of the charge trapping region 130 significantly improves scalability and functionality without complex fabrication techniques.

The location of the charge trapping region 130 in the body region 112 can be varied. In various embodiments, the location the charge trapping region 130 is on or near the BOX-body interface. In other embodiments, the charge trapping region 130 is located elsewhere in the body region 112 at a sufficient depth such that it will not interference with conductance. For example, various embodiments of the present subject matter position the charge trapping region 130 in the body region 112 at a depth below 200–300 Å (20–30 nm) from the surface where the charge flows.

The charge trapping region 130 provides localized quantum wells that are initially neutral. These neutral wells attract charges and maintain the charge species. Thus, charge traps are distinguished from recombination centers, which have been proposed in a body region to assist with the recombination of charges. Unlike the charge trapping regions, a recombination center provides a charged localized quantum well. The charged well attracts opposite charges which recombine to facilitate charge neutrality.

One of ordinary skill in the art will understand, upon reading and comprehending this disclosure, that the charge trapping region is capable of being tailored to provide the device with desired characteristics. For example, various embodiments of the present subject matter are designed to repeatedly trap and de-trap charges in the charge trapping region so as to form a non-volatile random access memory. Various embodiments provide a charge trapping region with deep traps, and are designed to form a non-volatile, write once, read only memory.

In various embodiments, the charge trapping function of the charge trapping region 130 is provided by a charge trapping layer. According to various embodiments, the charge trapping layer includes a silicon-rich-insulator (SRI) layer, such as a silicon-rich-nitride (SRN) or silicon-rich-oxide (SRO) layer, for example. SRI, SRN and SRO are described with respect to FIGS. 15–19 below in the section entitled Silicon Rich Insulators. One of ordinary skill in the art will understand, upon reading and comprehending this disclosure, that many other materials or combination of layers may be selected that provide the desired energy barriers, and thus provide the desired charge trapping characteristics.

As will be described in more detail below, positive charges (holes) are generated in the PD-SOI NFET due to impact ionization at the drain edge and alters the floating body potential. In this embodiment a part of these charges are trapped by the charge trapping region 130 (e.g. SRN layer) in the body region 112. The trapped charges effect the threshold voltage ($V_T$), and thus the channel conductance, of the PD-SOI-FET. According to various embodiments, the source current ($I_S$) of the PD-SOI-FET is used to determine if charges are trapped in the body region, and thus is used to determine the logic state of the memory cell.

Figure 2:
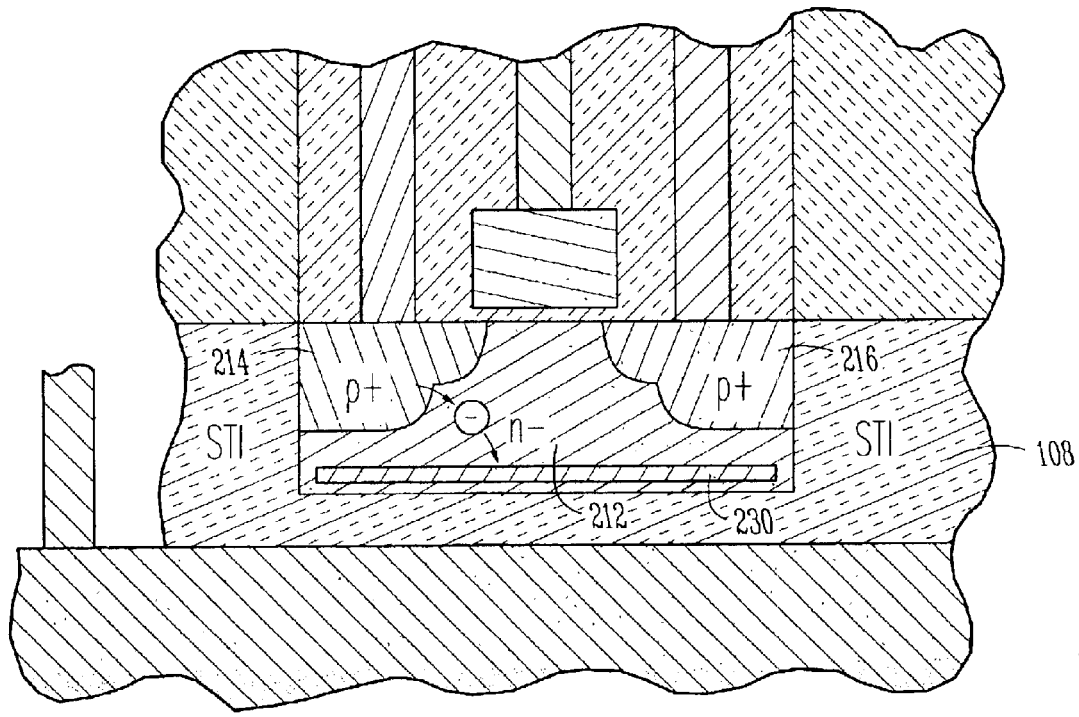
FIG. 2 illustrates a p-channel one transistor SOI non-volatile memory cell according to various embodiments of the present subject matter.

FIG. 2 illustrates a p-channel one transistor SOI non-volatile memory cell according to various embodiments of the present subject matter. One of ordinary skill in the art, upon reading and comprehending this disclosure, will understand the structural similarities between the PD-SOI-PFET device and the PD-SOI-NFET device. Some of these structural similarities are not addressed again here for the purpose of simplifying the disclosure.

With respect to the illustrated PD-SOI-PFET, the body region 212 is doped with n-type impurities, and the first and second diffusion regions 214 and 216 are doped with p+ impurities. Negative charges (electrons) are generated in the PD-SOI-PFET at the drain edge and alters the floating body potential. A part of these charges are trapped by the charge trapping region 230 (e.g. SRN layer) in the body region 212. The trapped charges affect the threshold voltage ($V_T$), and thus the channel conductance, of the PD-SOI-PFET in a similar fashion to the PD-SOI-NFET. According to various embodiments, the source current ($I_S$) of the PD-SOI-PFET is used to determine if charges are trapped in the body region, and thus is used to determine the logic state of the memory cell.

In order to simplify this disclosure, memory cells containing PD-SOI-NFET devices are illustrated and described. One of ordinary skill in the art will understand, upon reading and comprehending this disclosure, that the present subject matter is not limited to PD-SOI-NFET devices.

Figure 3:
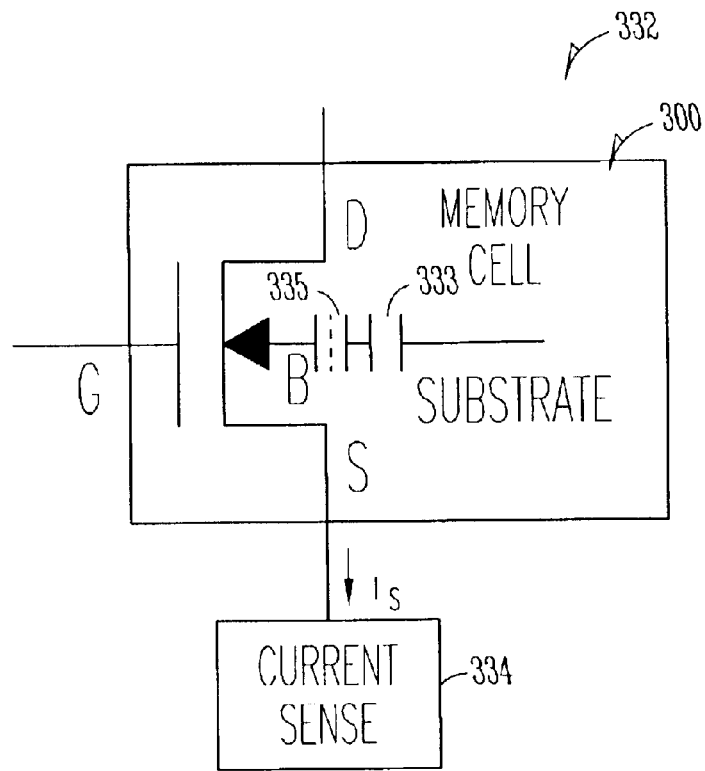
FIG. 3 illustrates a first memory read scheme according to various embodiments of the present subject matter.

FIG. 3 illustrates a first memory read scheme according to various embodiments of the present subject matter. In the illustrated system 332, the state of the cell 300 is sensed using a direct cell-current sense amplifier scheme. The memory cell 300 is connected to the current sense circuitry 334, which is used to sense the source current ($I_S$), and thus the state of the memory cell 300. The schematic of the memory cell illustrates a capacitive coupling between the substrate and the PD-SOI-NFET of the memory cell. As shown in FIG. 1, the BOX layer 106 forms a dielectric between the substrate 102 and the body region 112. Aside from the gate-body and body substrate capacitance 333 shown in FIG. 3, an additional series capacitance 335 is associated with the charge-trapping region. The charge trapping characteristics is illustrated by dotted lines in the capacitor 335.

The direct cell-current sense amplifier scheme can be compared to the sensing schemes associated with static random access memory (SRAM). One of ordinary skill in the art will understand, upon reading and comprehending this disclosure, that the memory cell can be designed and the performance of the memory cell specified such that the direct cell-current sense amplifier scheme can be used.

Figure 4:
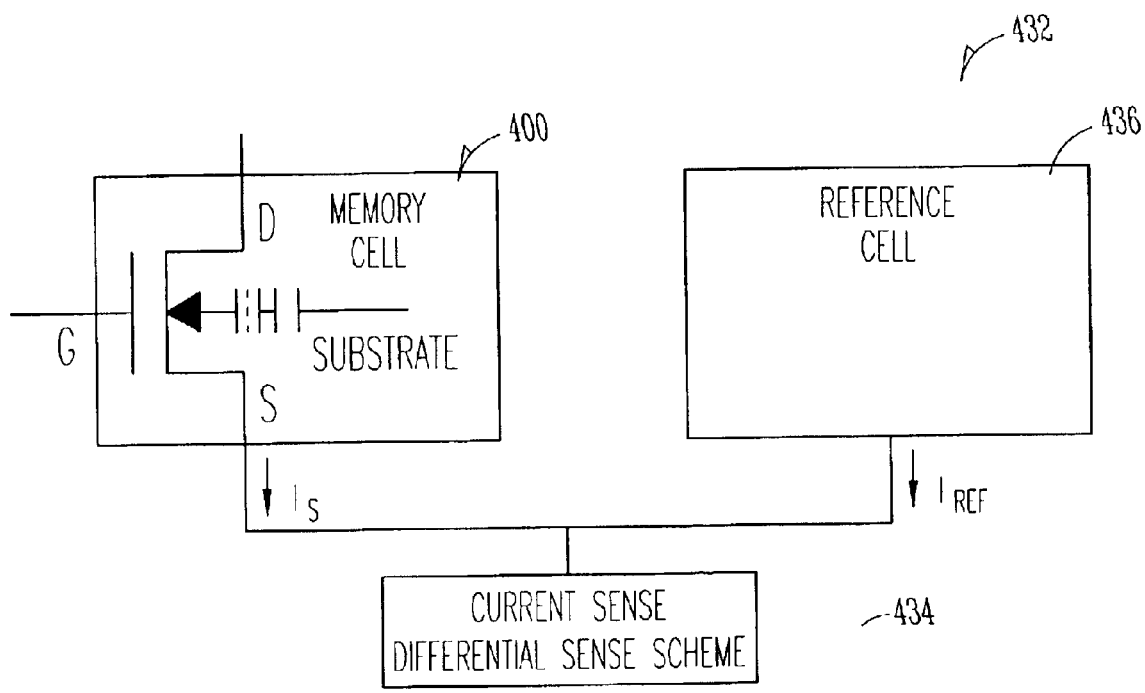
FIG. 4 illustrates a second memory read scheme according to various embodiments of the present subject matter.

FIG. 4 illustrates a second memory read scheme according to various embodiments of the present subject matter. In the illustrated system 432, the state of the cell 400 is sensed using a reference cell 436 and a current mode differential sense amplifier scheme. This scheme can be compared to the sensing schemes associated with dynamic random access memory (DRAM). Both the memory cell 400 and the reference cell 436 are connected to the current sense circuitry 434, which is used to compare the source current ($I_S$) of the memory cell 400 with the current ($I_{REF}$) of the reference cell 436 to determine the state of the memory cell 400.

Figure 5:
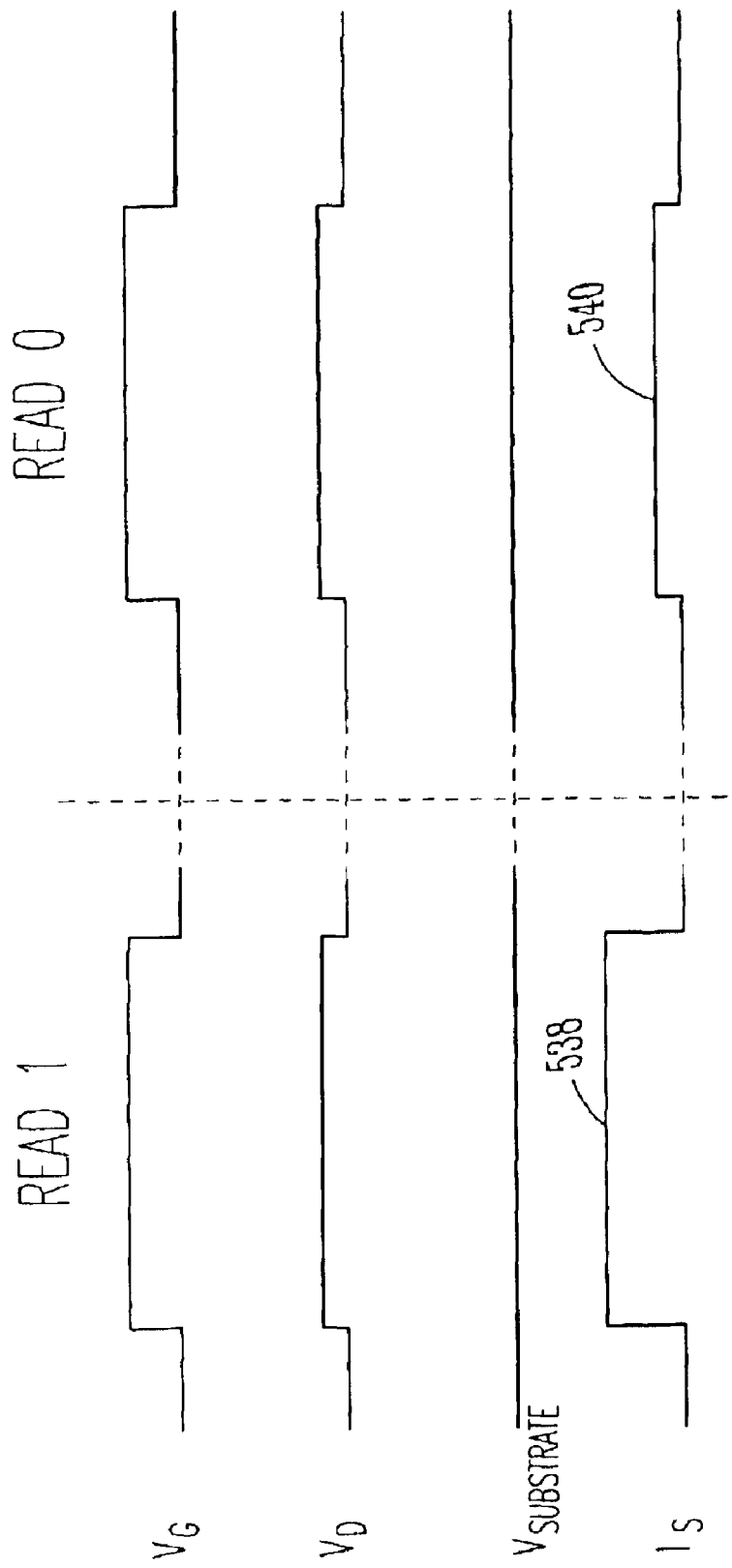
FIG. 5 illustrates electrical waveforms associated with reading a memory state "1" and a memory state "0" according to various embodiments of the present subject matter.

FIG. 5 illustrates electrical waveforms associated with reading a memory state "1" and a memory state "0" according to various embodiments of the present subject matter. For the illustrated read operations, a positive gate voltage ($V_G$) and a positive drain voltage ($V_D$) are applied while the substrate voltage is held at a reference voltage (e.g. ground). One of ordinary skill in the art will understand, upon reading and comprehending this disclosure, that the terms positive and negative are relative terms with respect to the reference voltage.

When the memory cell is in a memory state "1" in which holes are stored in the charge trapping region within the floating body of the PD-SOI NFET device, the threshold of the device decreases resulting in a higher source current ($I_S$), represented generally at 538. When the memory cell is in a memory state "0" in which the stored holes are neutralized in the floating body of the PD-SOI NFET device, the threshold of the device increases resulting in a lower source current ($I_S$), represented generally at 540. The difference between the source current in the memory state "1" can be two to three orders of magnitude greater than the source current in the memory state "0".

Memory Cell Operation

The one transistor SOI non-volatile memory cell of the present subject exploits the body charging associated with the excess carriers in the body (also referred to as floating body effect) of PD-SOI devices to store information. Part of the excess carriers in the floating body gets trapped and stored in the charge trapping layer in the body. This trapped stored charge in the transistor body affects the threshold voltage ($V_T$). A lower threshold voltage ($V_T$) increases the source current ($I_S$) of the transistor, and a higher threshold voltage ($V_T$) decreases the source current ($I_S$). The source current ($I_S$) of the memory cell transistor is used to determine the state of the memory cell.

There are a number of ways in which to generate the excess charge in a PD-SOI transistor. A first method for generating charge in PD-SOI transistors involves impact ionization in a field effect transistor (FET) operational mode. A second method for generating charge in PD-SOI transistors involves a relatively low field parasitic bipolar junction transistor turn-on mode. These methods for generating charge are described in detail below with respect to a memory operation embodiment for n-channel FET devices. The excess charge for the NFET devices are holes. One of ordinary skill in the art will understand, upon reading and comprehending this disclosure, how to generate complementary charge (electrons) using the high field impact ionization mode and the relatively low field parasitic bipolar transistor mode for p-channel FET devices.

FET Mode of Operation

The FET operational mode for generating charges in the body of a PD-SOI transistor involves high field impact ionization at the drain edge of the FET device. In various embodiments, the generated positive charge in the body region of the PD-SOI-NFET device is directed toward the charge traps in the body region by providing an appropriate electromotive force (EMF) field vertical (or normal) to the FET channel. The EMF field is provided by applying an appropriate voltage difference between the gate and the substrate.

Figure 6A:
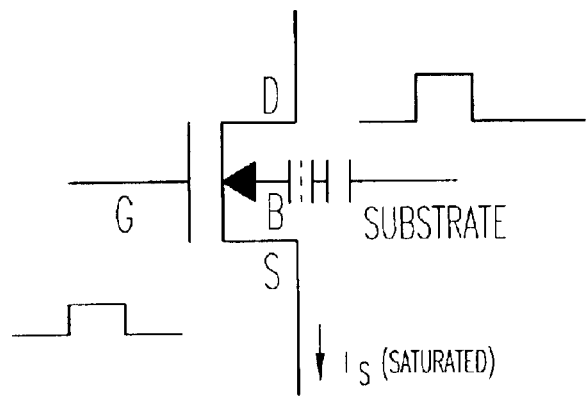
FIGS. 6A–6D illustrate a write operation for a memory cell in a FET mode of operation according to various embodiments of the present subject matter.
Figure 6B:
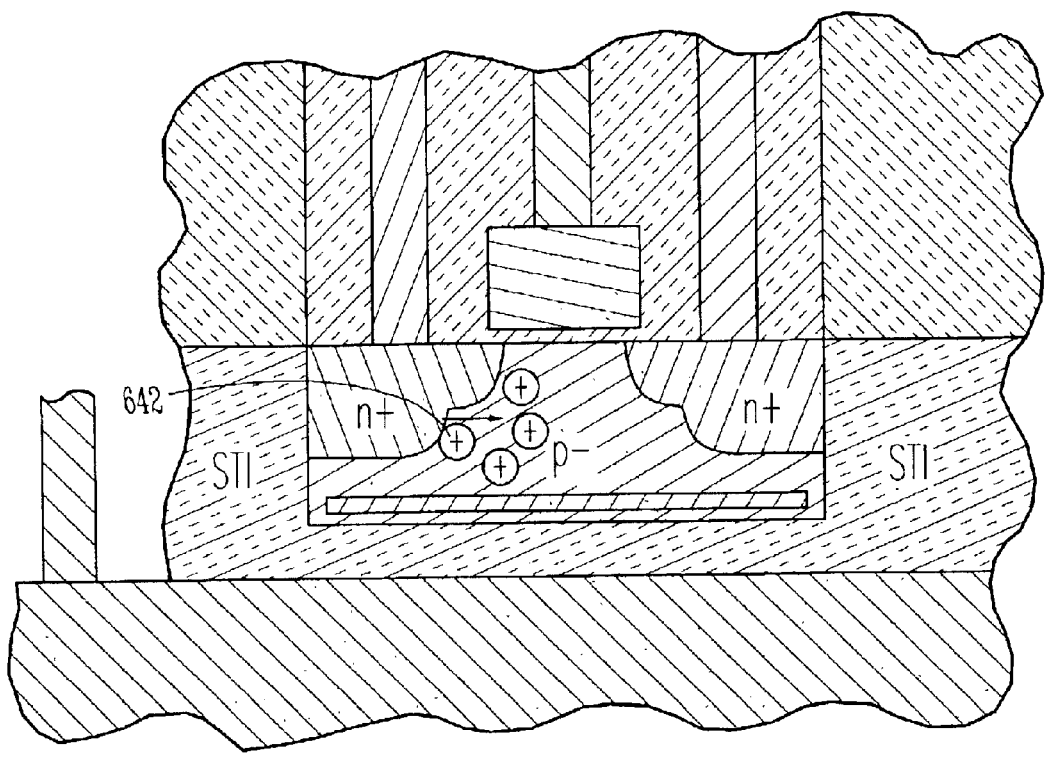
Figure 6C:
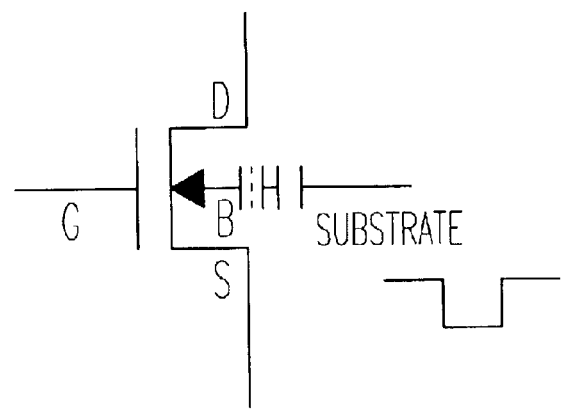
Figure 6D:
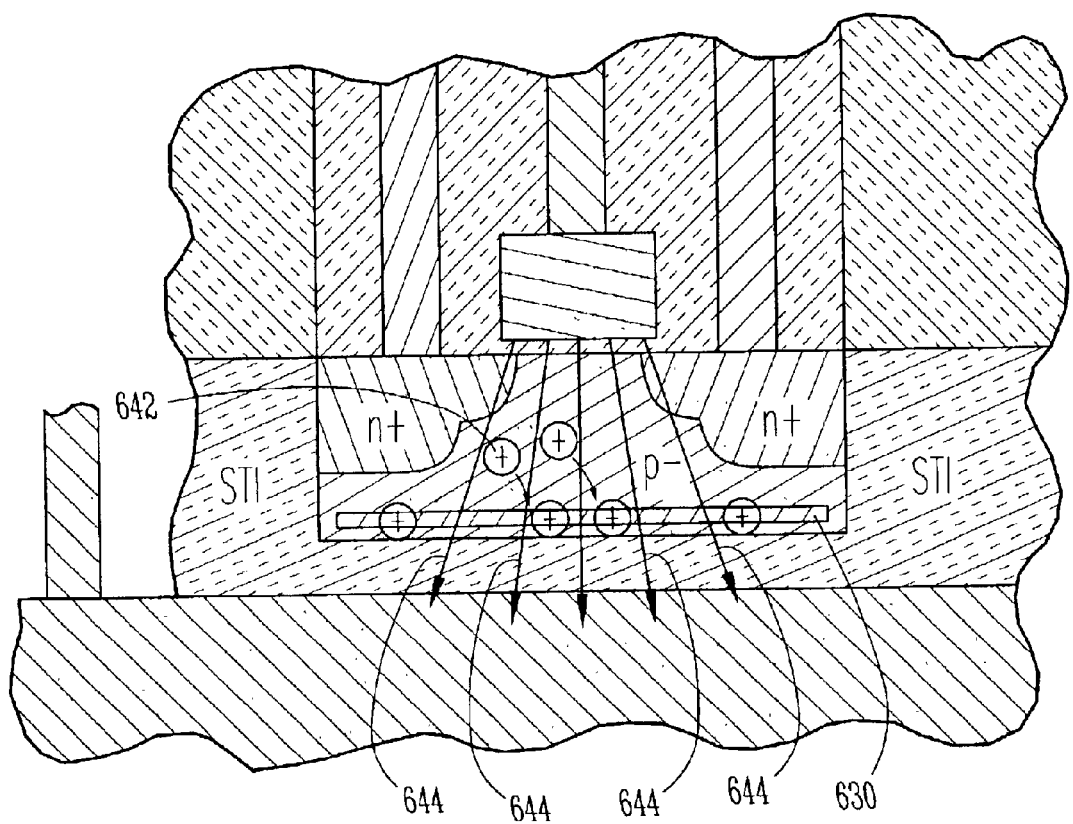

FIGS. 6A–6D illustrate a write operation for a memory cell in a FET mode of operation according to various embodiments of the present subject matter. In the FET operational mode, a high positive drain voltage pulse is applied when the word line is held high such that the transistor operates in saturation (FIG. 6A). An excess of positive body charge 642 is created near the drain region due to the impact ionization mechanism associated with the device operation in saturation (FIG. 6B). A negative substrate voltage pulse is applied (FIG. 6C) in a timely sequence after the positive charge is generated by the impact ionization mechanism. The negative substrate voltage provides a EMF field across the body region which causes the generated holes 642 to drift toward the charge trapping region 630 (FIG. 6D). In various embodiments, the charge trapping region 630 includes a layer of SRN near the BOX/body interface. In this state, the raised positive body potential lowers the threshold voltage ($V_T$) of the transistor.

Figure 7A:
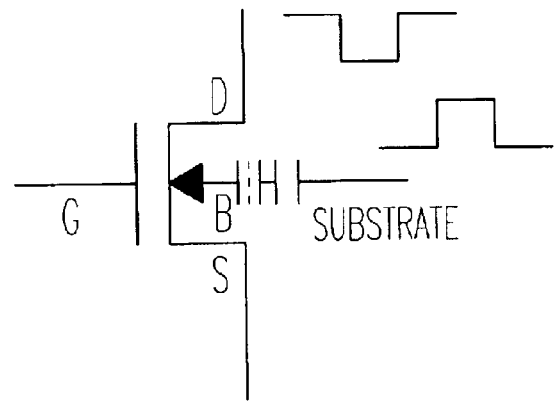
FIGS. 7A–7B illustrate an erase operation for a memory cell in a FET mode of operation according to various embodiments of the present subject matter.
Figure 7B:
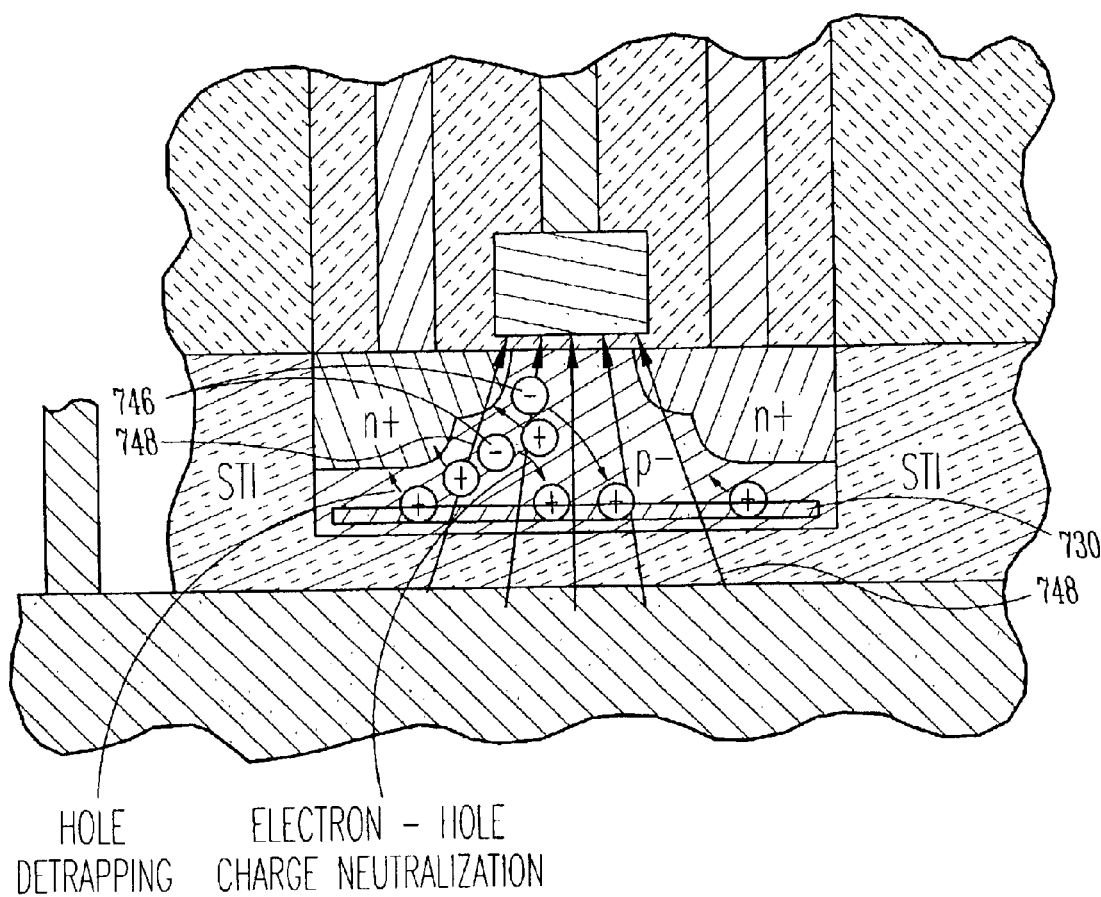

FIGS. 7A–7B illustrate an erase operation for a memory cell in an NFET-SOI mode of operation according to various embodiments of the present subject matter. A negative drain voltage pulse is applied to create an excess negative charge in the body. Additionally, a positive substrate voltage is applied in a timely sequence. An EMF field 748 is thereby set up from the substrate to the gate to attract the excess electrons toward the charge trapping region 730 which then neutralizes the trapped holes in the charge trapping region. The neutralization of the previously trapped positive charge lowers the body potential and consequently raises the threshold voltage ($V_T$) of the transistor.

Figure 8:
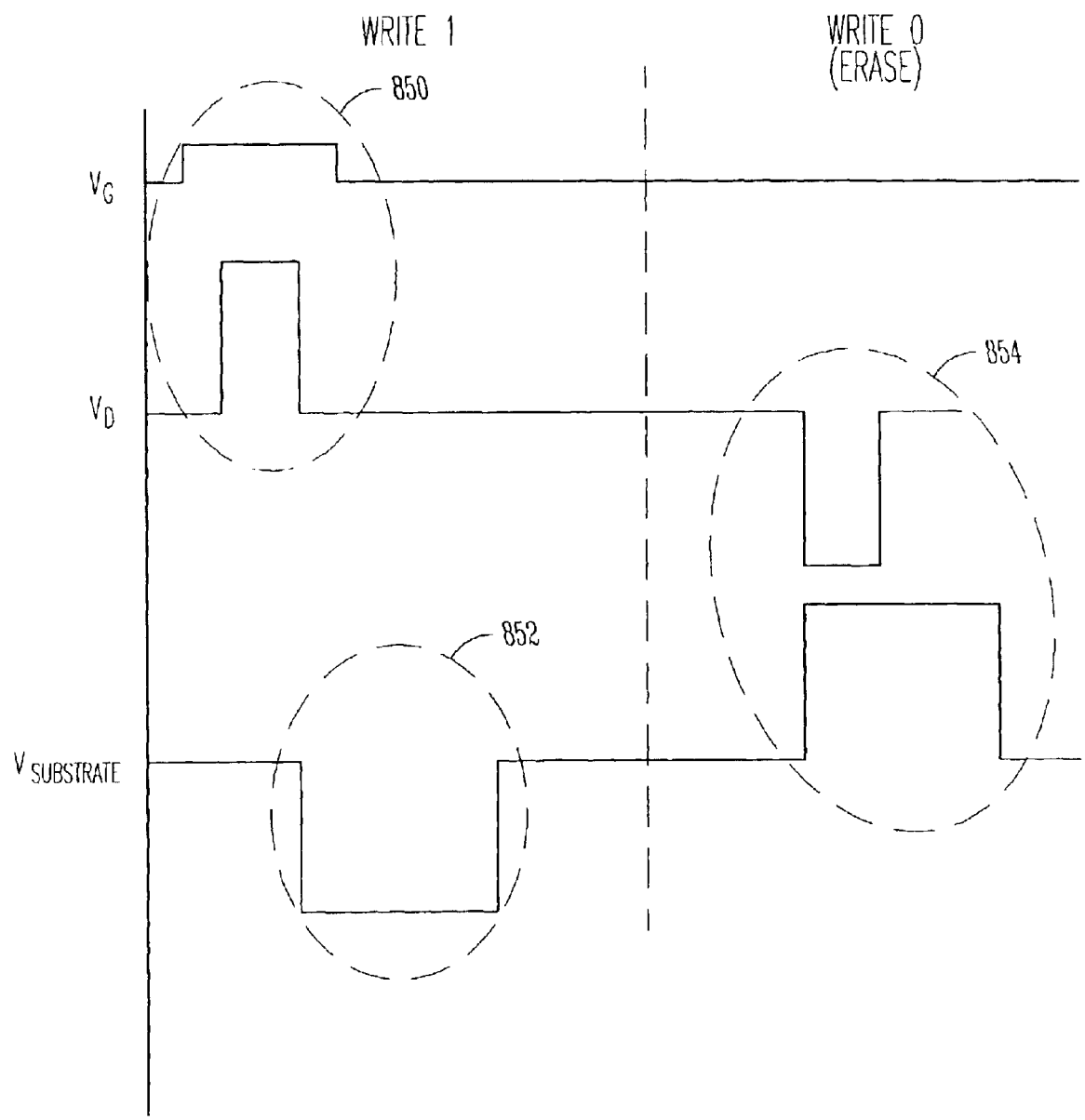
FIG. 8 illustrates electrical waveforms associated with writing and erasing a memory cell in a FET mode of operation according to various embodiments of the present subject matter.

FIG. 8 illustrates electrical waveforms associated with writing and erasing a memory cell in a FET mode of operation according to various embodiments of the present subject matter. A write 1 operation for a PD-SOI-NFET device involves generating excess holes and trapping the holes in the trapping layer of the body region of the device. The positive gate voltage pulse and the large drain voltage pulse, shown within the dotted line 850, causes the PD-SOI-NFET to turn on and operate in a saturated mode. An excess of positive charges (holes) are generated in the PD-SOI-NFET body due to impact ionization at the drain edge. The excess holes generated by impact ionization are directed toward the charge trapping region due to the EMF field associated with the large negative substrate voltage pulse sequentially imposed in relationship of 850 and shown within the dotted line 852.

According to various embodiments, a write 0 operation, also referred to as an erase operation, for the PD-SOI-NFET device involves neutralizing the trapped holes with electrons generated in the body region of the device. Electrons are generated in the body region by forward biasing the p-n+ junction using a negative drain pulse and a positive substrate pulse, shown within the dotted line 854. The generated electrons drift toward the charge trapping region, where the electrons neutralize the stored holes. The positive substrate pulse extends for a duration longer than the negative drain pulse to provide an EMF field across the body that assists the drift of the generated electrons toward the charge trapping region.

Bipolar Junction Transistor (BJT) Mode of Operation

The lateral parasitic Bipolar Transistor mode for generating charges in the body of a PD-SOI transistor involves a relatively low field mechanism. The n-channel FET device includes a parasitic lateral NPN bipolar junction transistor (BJT). Various voltages are applied to the memory cell to cause the NPN transistor to generate positive charges (holes). In various embodiments, the generated positive charge is directed toward the charge trapping region in the body region by providing an appropriate electromotive force (EMF) field across the body by applying an appropriate voltage difference between the gate and the substrate.

Figure 9A:
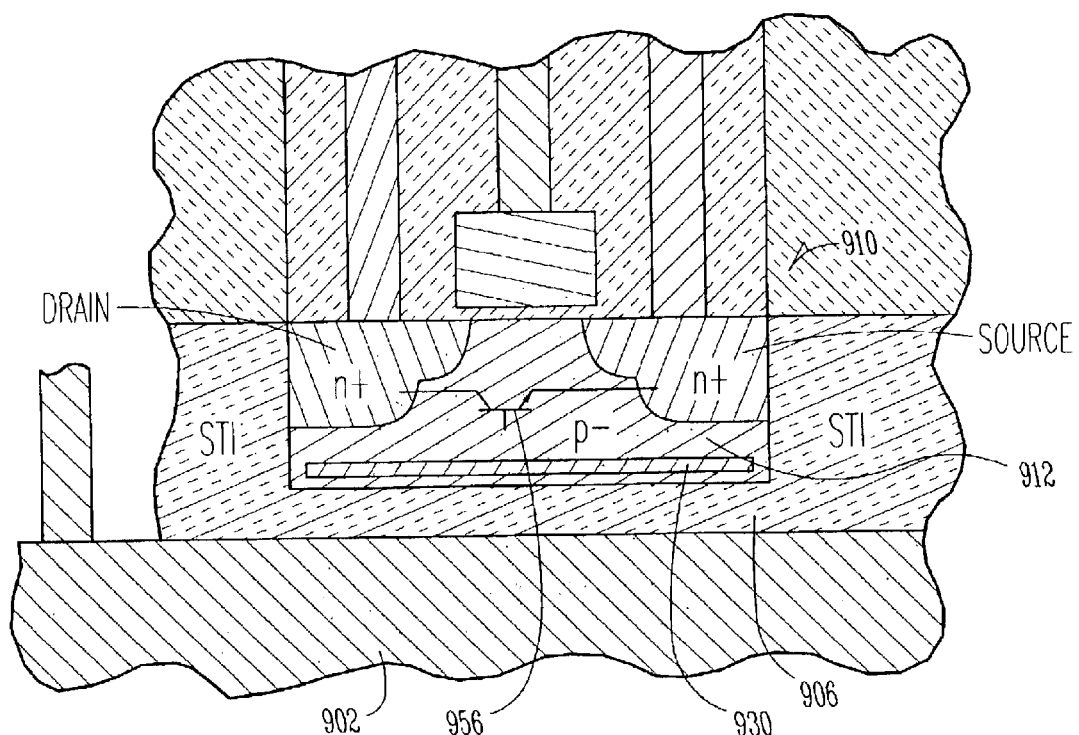
FIGS. 9A–9B illustrate a lateral parasitic bipolar junction transistor (BJT) associated with a FET device in the memory cell according to various embodiments of the present subject matter.
Figure 9B:
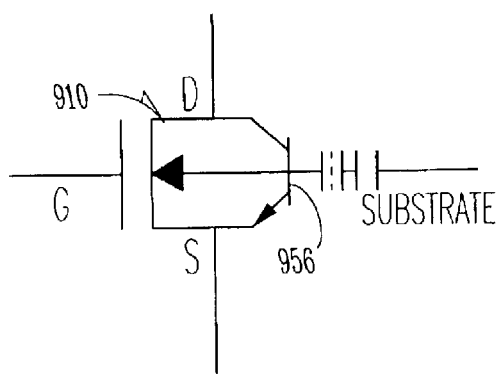

FIGS. 9A–9B illustrate a lateral parasitic bipolar junction transistor (BJT) associated with a FET device in the memory cell according to various embodiments of the present subject matter. The PD-SOI-NFET transistor 910 includes a parasitic NPN transistor 956, as illustrated in FIG. 9A. One of ordinary skill in the art will understand, upon reading and comprehending this disclosure, how to apply the teachings contained herein to a parasitic lateral PNP transistor in a PD-SOI-PFET transistor.

FIG. 9B is a schematic diagram of the memory cell of the present subject matter, and generally illustrates the parasitic BJT 956 in the PD-SOI-NFET transistor 910. The substrate 902 is capacitively coupled across the BOX layer 906 to the body region 912 of the NFET transistor, which also functions as the base of the parasitic NPN transistor. The body region 912 includes charge trapping region 930, such as an SRN charge trapping layer, for example. For clarity, the body-substrate capacitor in the embodiment consists of two series capacitors: the trapping layer capacitor and the BOX capacitor between the body and the substrate, as shown.

Figure 10A:
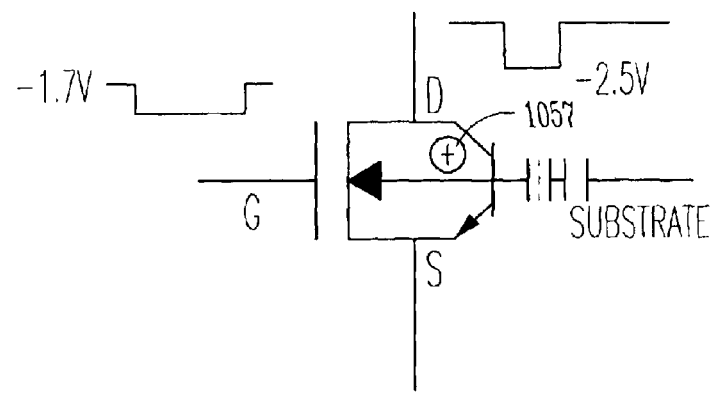
FIGS. 10A–10D illustrate a write operation for a memory cell in a parasitic BJT mode of operation according to various embodiments of the present subject matter.
Figure 10B:
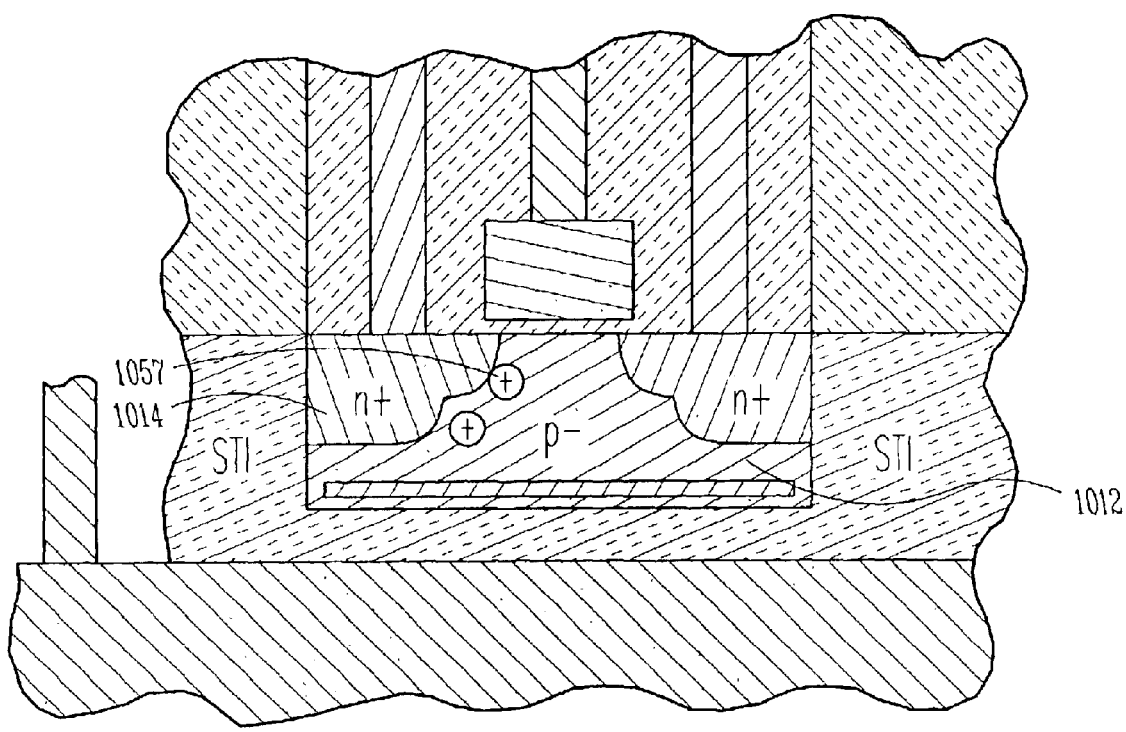
Figure 10C:
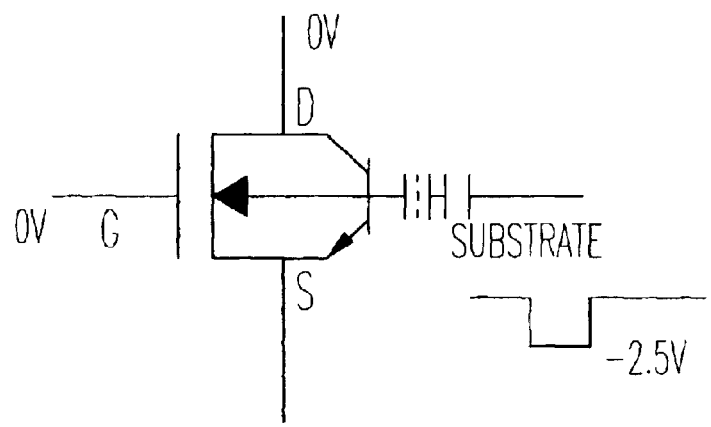
Figure 10D:
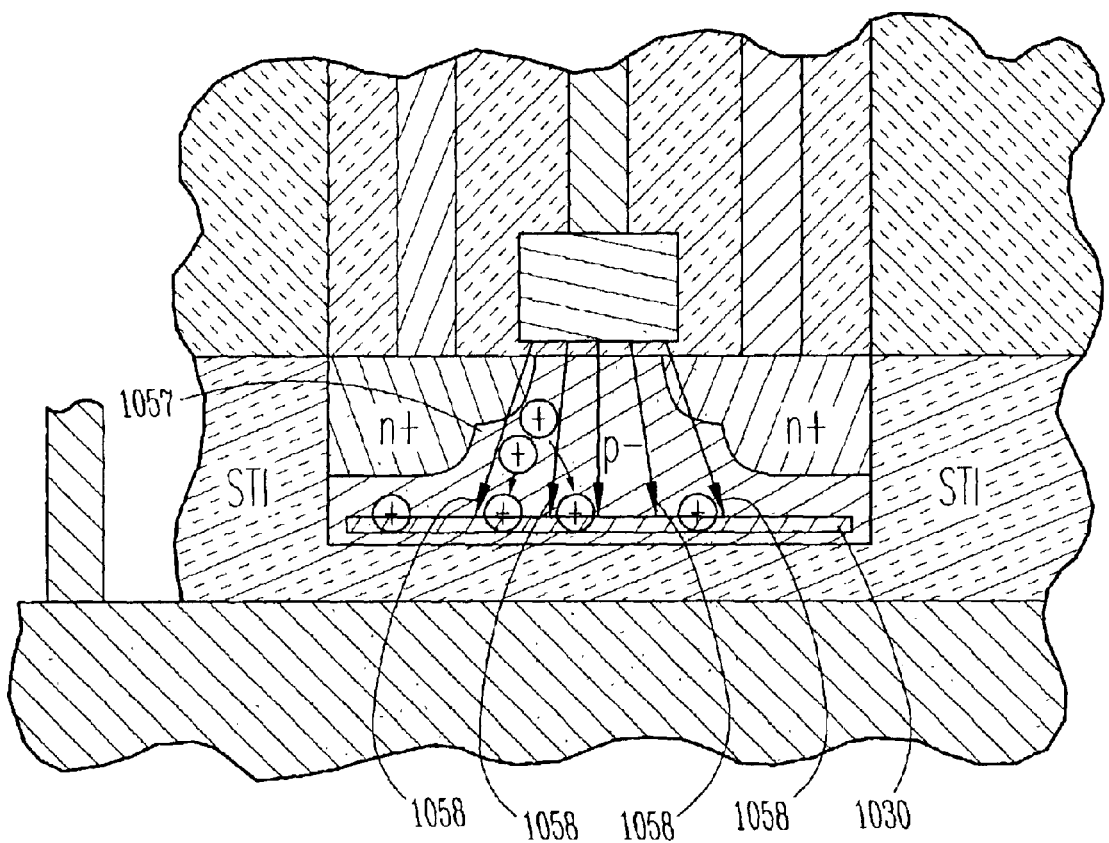

FIGS. 10A–10D illustrate a write operation for a memory cell in a parasitic BJT mode of operation according to various embodiments of the present subject matter. A negative gate pulse is applied, and a negative drain pulse (having a shorter duration than the gate pulse) is applied during the negative gate pulse (FIG. 10A). The gate voltage is capacitively coupled simultaneously to the source and the body region while forward biasing the p-n+junction between the body region 1012 and the drain diffusion region 1014. In this condition, the lateral NPN transistor action generates excess holes 1057 near the drain region 1014 of the PD-SOI-NFET (FIG. 10B). As the gate pulse returns to ground, the substrate is pulsed negative (FIG. 10C). This negative substrate pulse provides a vertical drift field 1058 through the body from the gate to the substrate (FIG. 10D). The vertical drift field 1058 causes the generated holes 1057 to drift toward the charge trapping 1030 in the body of the transistor. Thus, the charge trapping region stores at least a portion of the hole charges generated in the body region.

Figure 11A:
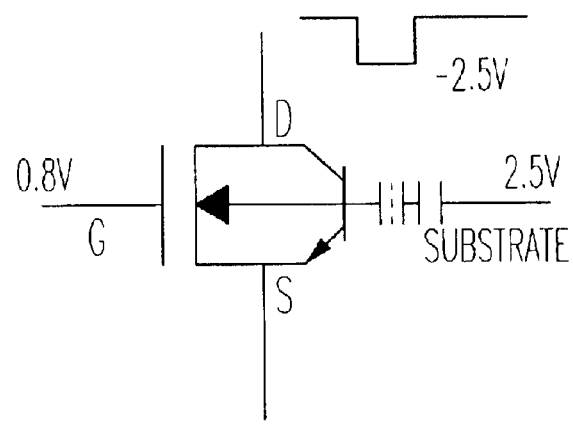
FIGS. 11A–11B illustrate an erase operation for a memory cell in a parasitic BJT mode of operation according to various embodiments of the present subject matter.
Figure 11B:
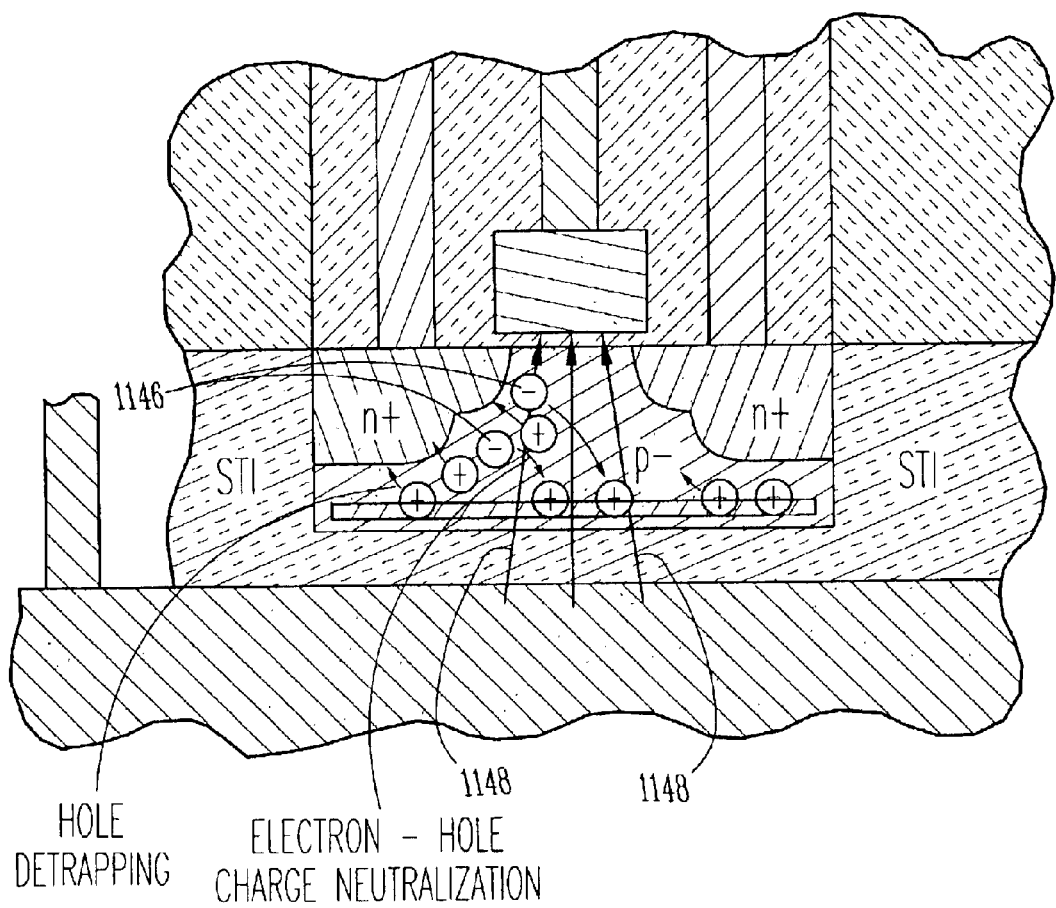

FIGS. 11A–11B illustrate an erase operation for a memory cell in a parasitic BJT mode of operation according to various embodiments of the present subject matter. The drain-body diode (n+-p) is forward biased by providing a negative drain pulse and a positive substrate pulse (FIG. 11A). The forward biased diode generates electrons 1146 in the body region (FIG. 1B). The gate is kept at a constant low positive potential as the substrate pulse is applied. The applied substrate pulse overlaps the negative drain pulse. The positive substrate voltage creates a vertical drift field 1148 to push the generated electrons 1146 toward the charge traps, which neutralizes the trapped holes in the body region of the PD-SOI-NFET device (FIG. 11B).

Figure 12:
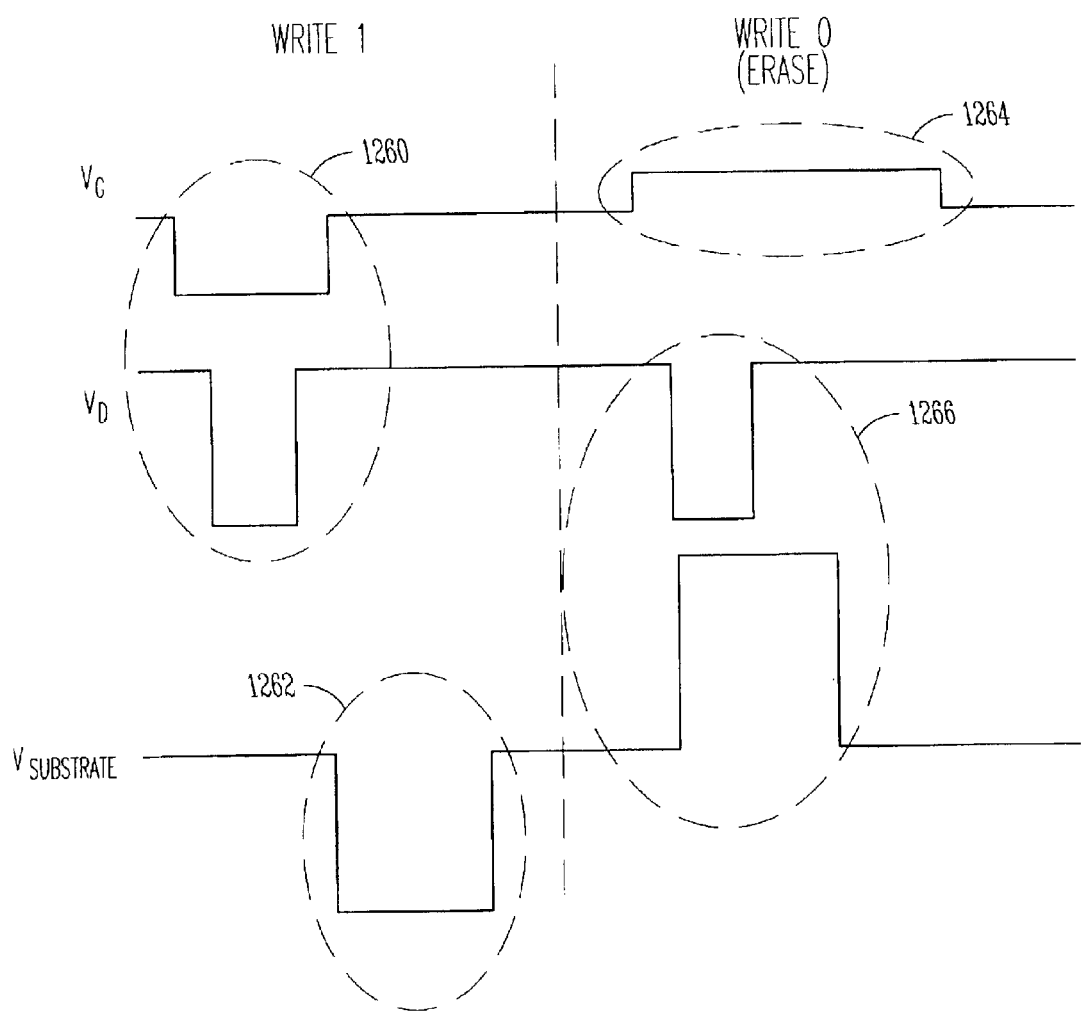
FIG. 12 illustrates electrical waveforms associated with writing and erasing a memory cell in a parasitic bipolar mode of operation according to various embodiments of the present subject matter.

FIG. 12 illustrates electrical waveforms associated with writing and erasing a memory cell in a parasitic BJT mode of operation according to various embodiments of the present subject matter. A write 1 operation for a PD-SOI NFET device involves generating holes and trapping the holes in body region of the device. The negative gate voltage pulse and the large negative drain voltage pulse, shown within the dotted line 1260, causes the parasitic bipolar transistor to generate holes in the body region of the PD-SOI NFET. It is noted that the negative gate voltage pulse capacitively couples both the source and the body region, and the body region functions as the base of the parasitic BJT transistor. The body-drain junction is forward biased because the drain voltage is more negative than the gate voltage. Near the end of the gate voltage pulse, a large negative substrate voltage pulse, shown within the dotted line 1262, provides an EMF field that directs the generated holes toward the charge trapping region.

A write 0 operation, also referred to as an erase operation, for the PD-SOI NFET device involves neutralizing the trapped holes with electrons generated in the body region of the device. A small positive voltage, illustrated by the dotted line 1264, is applied to the gate. Electrons are generated in the body region by forward biasing the p-n+junction using a negative drain pulse and a positive substrate pulse, shown within the dotted line 1266. The electron drift is toward the charge traps, where the electrons neutralize the stored holes. The positive substrate pulse extends for a duration longer than the negative drain pulse, allowing the substrate pulse and the gate potential to provide an EMF field that assists the drift of the generated electrons toward the charge centers of the charge trapping region (charge trapping layer).

The following table provides one example of a BJT mode of operation in which Vdd=2.5 V.

| OPERATION | BIT LINE | WORD LINE | SUB-STRATE | REMARKS |
|---|---|---|---|---|
| Write "1" | −2.5 V<br>1–5 ns | −1.7 V<br>2–10 ns | −2.5 V<br>2–10 ns | Holes are generated in the body and are trapped in the trapping layer. $V_T$ is reduced by 200 mV. |
| Write "0" | −2.5 V<br>1–5 ns | 0.8 V | 2.5 V<br>2–10 ns | Electrons are generated in the body and neutralize the trapped holes. $V_T$ returns to original value. |
| Half-Select Cells | 0.3 V | As above. | As above. | No change. |
| Read "1" | 0.3 V | 0.8 V | Gnd | Current is 2–3 orders of magnitude higher. |
| Read "0" | 0.3 V | 0.8 V | Gnd | Current is lower. Device threshold is designed to put the device in sub-threshold operation for a Read "0" operation. |

Scalability of Memory Cell

According to various embodiments, the memory cell is fully scalable. The functionality of the memory cell is independent of the feature size. The cell density directly benefits from the reduction in feature size. Additionally, contrary to the characteristics of the conventional DRAM cell, this memory cell improves in functionality and characteristics as the feature size is reduced due to the following reasons. One reason is that the device short channel effect improves due to the reduction in the volume of neutral region of the body and due to the "narrow-width-effect" that raises the "base" threshold of the device. Another reason is that charge trapping efficiency is improved due to the increase in carrier energy of the excess carriers as the body volume is reduced. The device leakage is also reduced due to both of these reasons. Additionally, trapped charges extend the body depletion regions, reducing device parasitic capacitance. This further improves intrinsic device switching speed.

System Level

Figure 13:
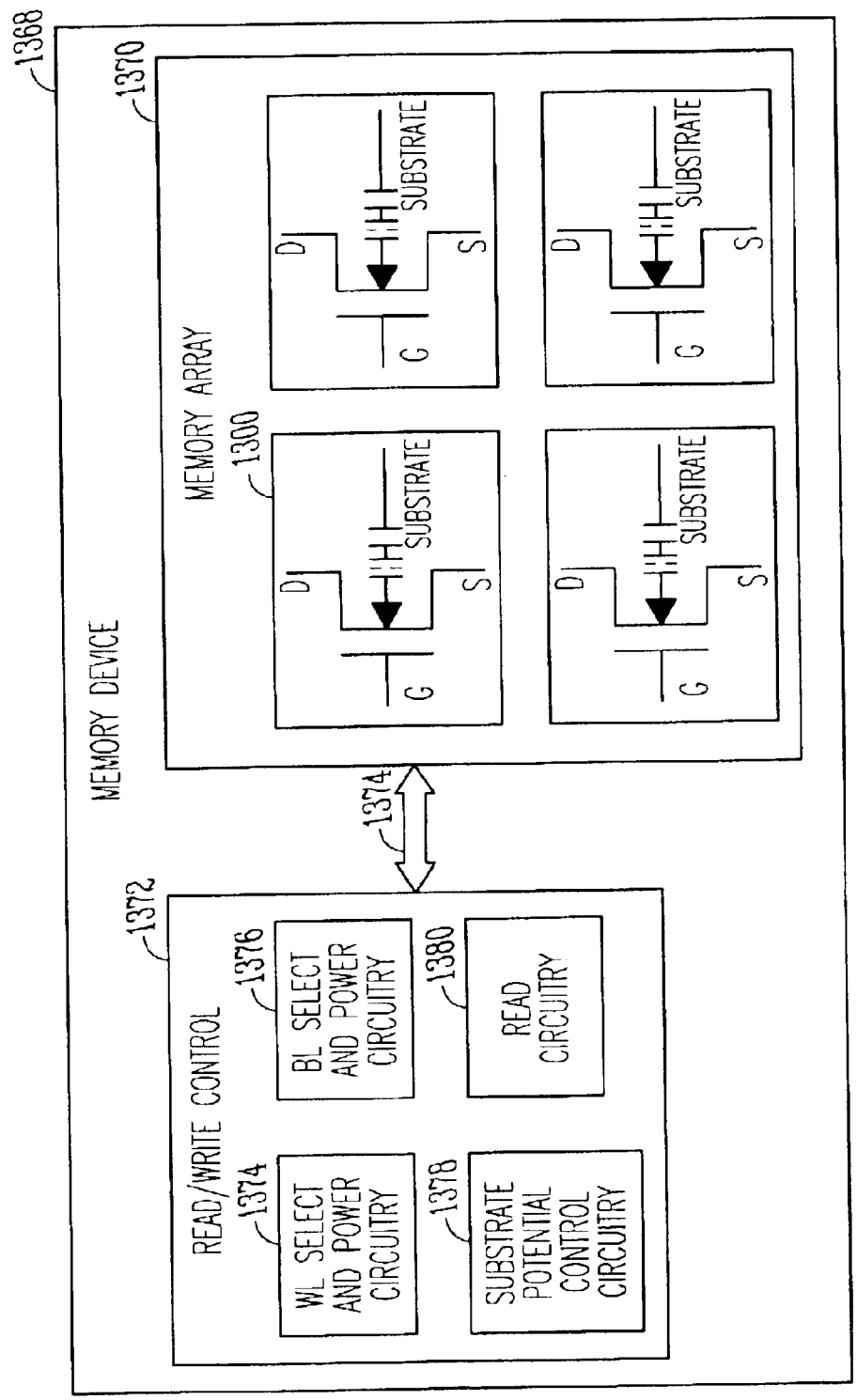
FIG. 13 is a simplified block diagram of a high-level organization of various embodiments of a memory device according to various embodiments of the present subject matter.

FIG. 13 is a simplified block diagram of a high-level organization of various embodiments of a memory device according to various embodiments of the present subject matter. The illustrated memory device 1368 includes a memory array 1370 and read/write control circuitry 1372 to perform operations on the memory array via communication line(s)1374.

The memory array 1370 includes a number of one transistor SOI non-volatile memory cells 1300 as described above. Although the illustrated memory cells 1300 include PD-SOI NFET devices, the present subject matter is not limited to PD-SOI-NFET devices. The memory cells in the array are arranged in rows and columns. In various embodiments, word lines connect the memory cells in the rows, and bit lines connect the memory cells in the columns. According to various embodiments, the memory cells in the array are formed in a single substrate. According to various embodiments, the substrate for one or more memory cells is isolated from the substrate(s) for other memory cells. Thus, these embodiments provide the ability to provide different substrate voltages to different portions of the memory array.

The read/write control circuitry 1372 includes word line select and power circuitry 1374, which functions to select a desired row and to provide a desired power signal or pulse to the selected row. The read/write control circuitry 1372 further includes bit line select and power circuitry 1376, which functions to select a desired column and to provide a desired power signal or pulse to the selected column. The read/write control circuitry 1372 further includes substrate potential control circuitry 1378 which functions to provide a desired power signal or pulse to the substrate. According to various embodiments in which the memory array includes a number of isolated substrates, the substrate potential control circuitry 1378 also functions to select a desired substrate to which the desired power signal or pulse is applied. The read/write control circuitry 1372 further includes read circuitry 1380, which functions to detect a memory state for a selected memory cell in the memory array 1370. According to various embodiments, the read circuitry 1380 uses a direct cell-current sense amplifier scheme such as that illustrated in FIG. 3. According to various embodiments, the read circuitry 1380 uses a reference cell and a current mode differential sense amplifier scheme such as that illustrated in FIG. 4.

Figure 14:
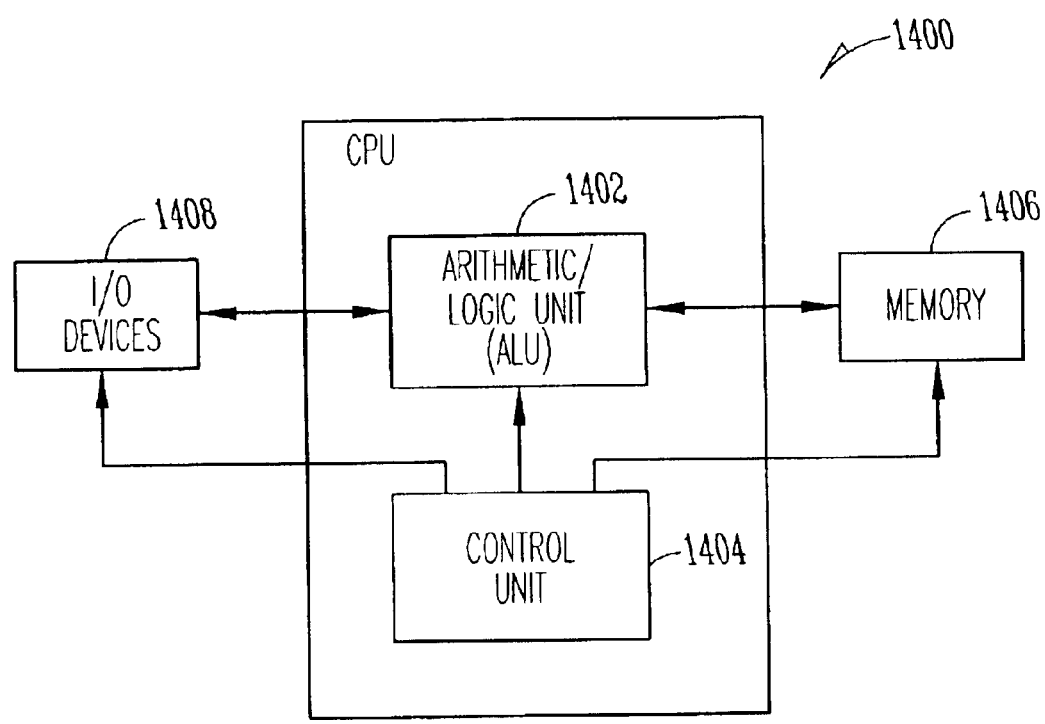
FIG. 14 is a simplified block diagram of a high-level organization of various embodiments of an electronic system according to the present subject matter.

FIG. 14 is a simplified block diagram of a high-level organization of various embodiments of an electronic system according to the present subject matter. In various embodiments, the system 1400 is a computer system, a process control system or other system that employs a processor and associated memory. The electronic system 1400 has functional elements, including a processor or arithmetic/logic unit (ALU) 1402, a control unit 1404, a memory device unit 1406 and an input/output (I/O) device 1408. Generally such an electronic system 1400 will have a native set of instructions that specify operations to be performed on data by the processor 1402 and other interactions between the processor 1402, the memory device unit 1406 and the I/O devices 1408. The control unit 1404 coordinates all operations of the processor 1402, the memory device 1406 and the I/O devices 1408 by continuously cycling through a set of operations that cause instructions to be fetched from the memory device 1406 and executed. According to various embodiments, the memory device 1406 includes, but is not limited to, random access memory (RAM) devices, read-only memory (ROM) devices, and peripheral devices such as a floppy disk drive and a compact disk CD-ROM drive. As one of ordinary skill in the art will understand, upon reading and comprehending this disclosure, any of the illustrated electrical components are capable of being fabricated to include one-transistor, non-volatile SOI memory cells in accordance with the present subject matter.

The illustration of the system 1400 is intended to provide a general understanding of one application for the structure and circuitry of the present subject matter, and is not intended to serve as a complete description of all the elements and features of an electronic system using one-transistor, SOI non-volatile memory cells according to the present subject matter. As one of ordinary skill in the art will understand, such an electronic system can be fabricated in single-package processing units, or even on a single semiconductor chip, in order to reduce the communication time between the processor and the memory device.

Applications containing one-transistor, SOI non-volatile memory cells, as described in this disclosure, include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

Silicon Rich Insulators as Charge Trapping Layer

According to various embodiments of the present subject matter, a silicon-rich-insulator (SRI), such a silicon-rich-nitride (SRN) or silicon-rich-oxide (SRO), is used to provide charge traps in the body region of PD-SOI-FET devices. In various embodiments, a layer of SRI is formed in the body region near an interface between the body region and the BOX layer. One of ordinary skill in the art will understand, upon reading and comprehending this disclosure, that FIGS. 15–19 further describe SRI material.

Figure 15:
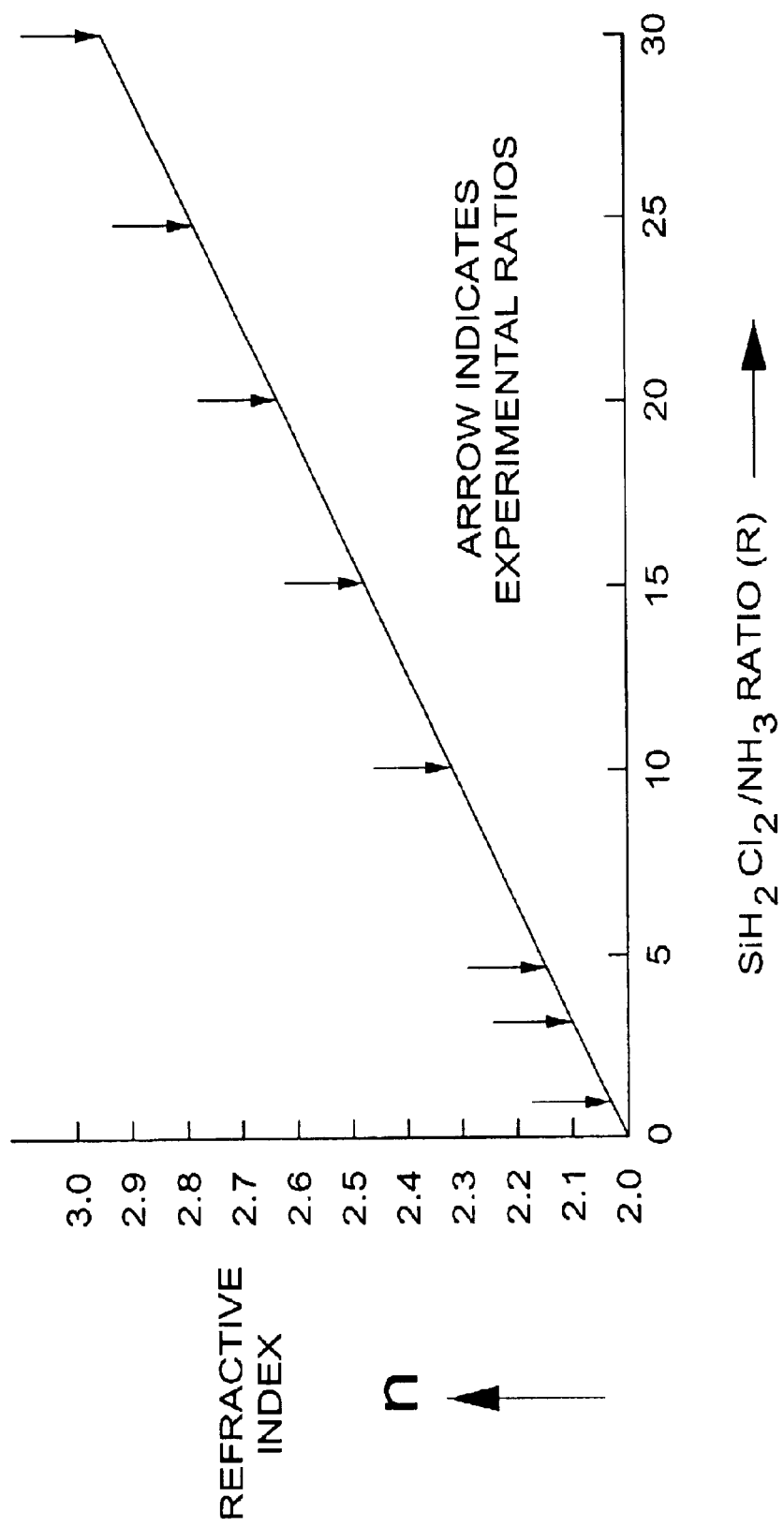
FIG. 15 is a graph showing refractive index of silicon-rich silicon nitride films versus $SiH_2Cl_2/NH_3$ flow rate ratio.

FIG. 15 is a graph showing refractive index of silicon-rich silicon nitride films versus $SiH_2Cl_2/NH_3$ flow rate ratio (R). This graph is provided herein to illustrate the relationship between the silicon amount and the refractive index. The graph indicates that the index of refraction increases linearly with increasing silicon content. As such, the index of refraction of the films can be used as an indication of the silicon content of the films.

Figure 16:
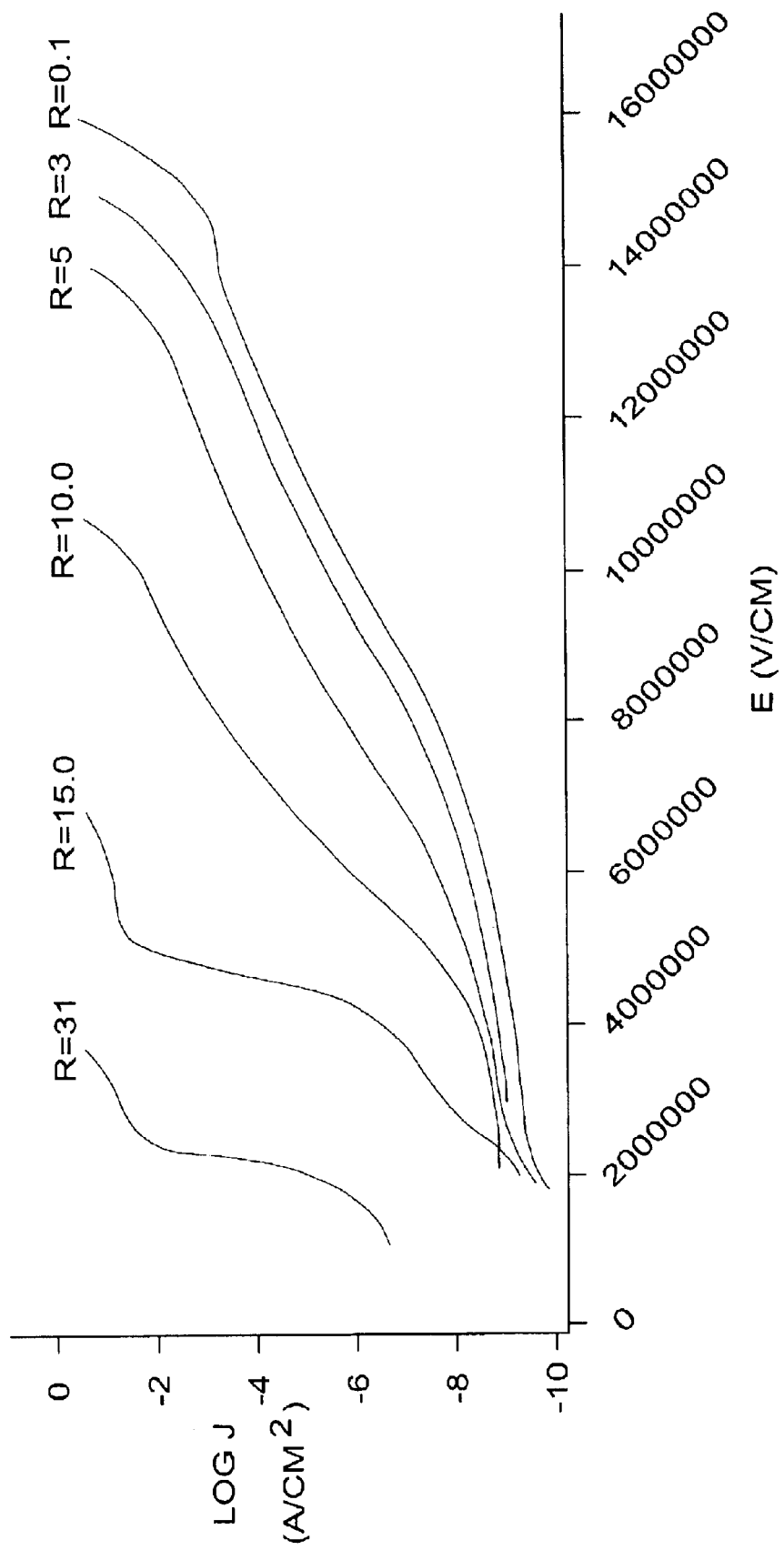
FIG. 16 is a graph showing current density versus applied field for silicon-rich silicon nitride films having different percentages of excess silicon.

FIG. 16 is a graph showing current density versus applied field for silicon-rich silicon nitride films having different percentages of excess silicon. The current density (J) is represented in amperes/cm$^2$, and log J is plotted against the electric field E (volts/cm) for $Si_3N_4$ layers having a $SiH_2Cl_2/NH_3$ flow rate ratio R of 0.1, 3, 5, 10, 15 and 31. This graph is provided herein to illustrate the relationship between the amount of silicon and the conductivity of the film. The plot shows that the $Si_3N_4$ layers having small additions of silicon (R=3 and 5) exhibit a relatively small conductivity increase over stoichiometric $Si_3N_4$. The plot further shows that increasing silicon content at or above R=10 substantially increases or enhances the conductivity.

Figure 17:
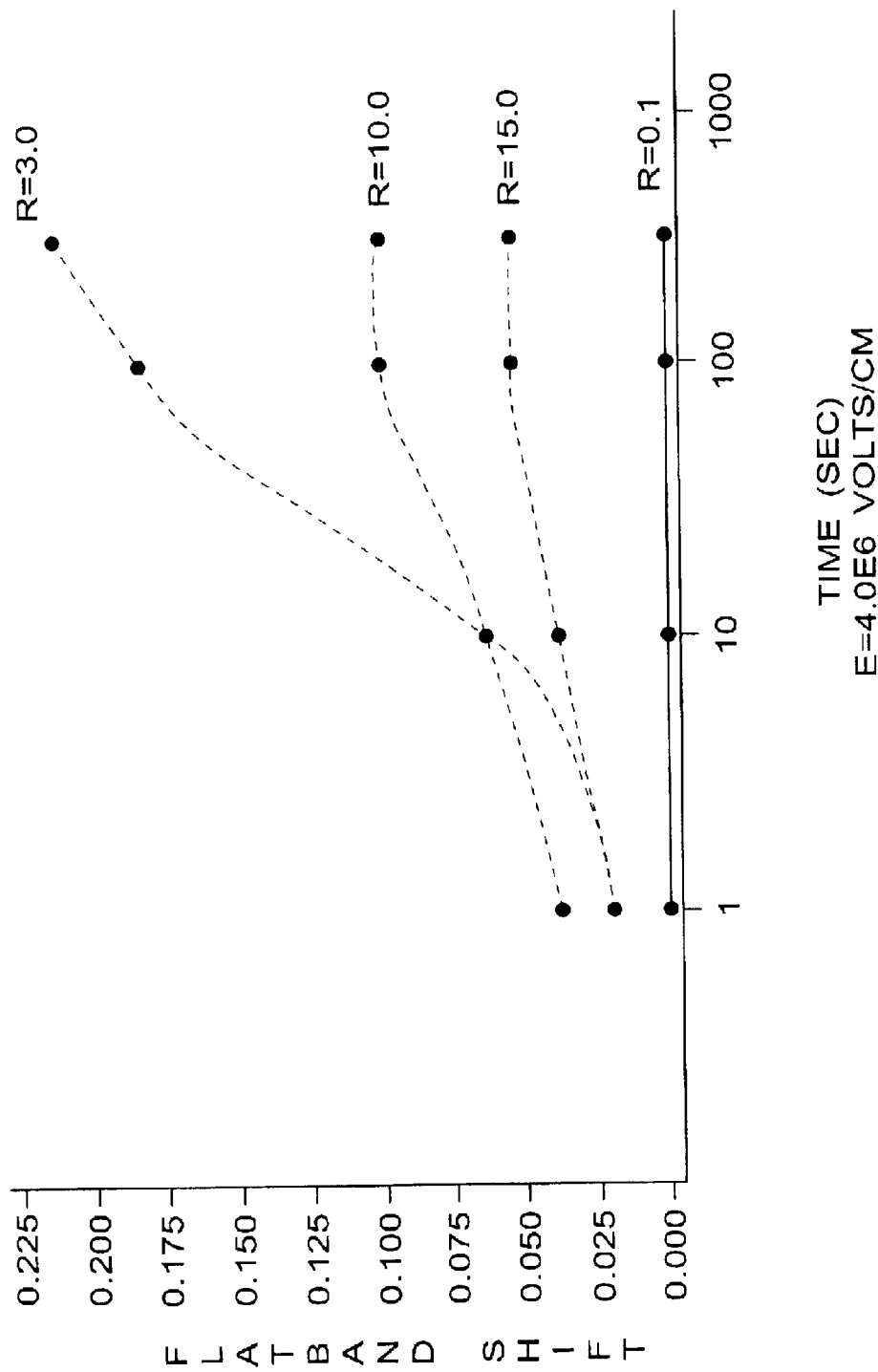
FIG. 17 is a graph showing flat band shift versus time at an applied field of $4 \times 10^6$ volts/cm for silicon-rich silicon nitride films having varying percentages of excess silicon.
Figure 18:
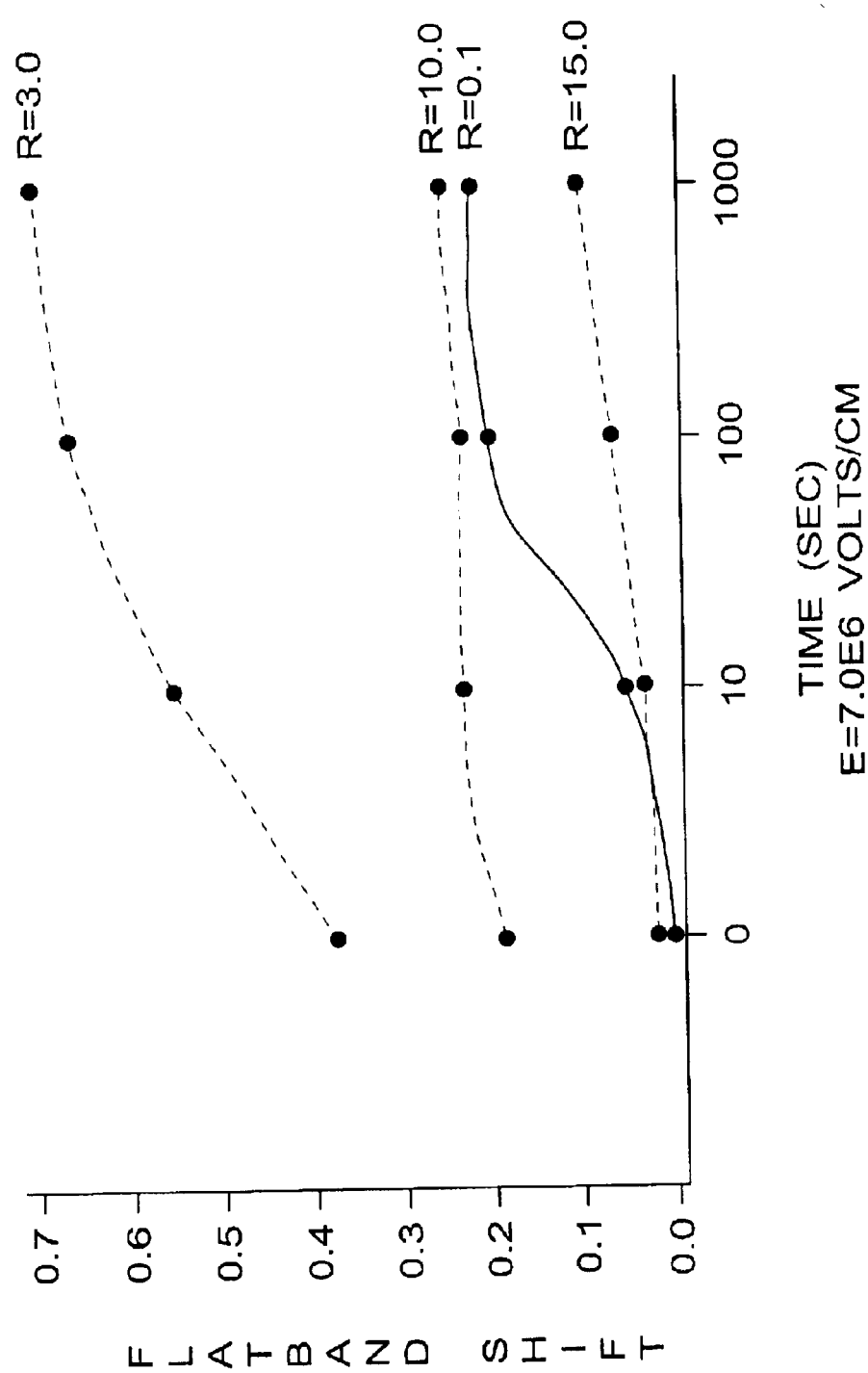
FIG. 18 is a graph showing flat band shift versus time at an applied field of $7 \times 10^6$ volts/cm for silicon-rich silicon nitride films having varying percentages of excess silicon.

FIGS. 17 and 18 provide graphs that illustrate the relationship between the flatband shift and applied fields for films having varying percentages of excess silicon as represented by the $SiH_2Cl_2/NH_3$ flow rate ratio R. FIG. 17 is a graph showing flatband shift versus time at an applied field of $4\times10^6$ volts/cm for silicon-rich silicon nitride films having varying percentages of excess silicon. For R=3, the flatband shift is greater than the shifts produced by films having an R of 0.1, 10 or 15. The film having an R of 10 provides a greater flatband shift than a film having an R of 15. FIG. 18 is a graph showing flatband shift versus time at an applied field of $7\times10^6$ volts/cm for silicon-rich silicon nitride films having varying percentages of excess silicon. The flatband shift produced by the R=3 film is even greater than that shown in FIG. 17, while the shifts produced by the R=10 and R=15 films do not change as appreciably. FIGS. 17 and 18 are provided to illustrate the characteristics of a charge storing medium and a more conductive charge injector medium as further explained below.

The graphs of FIGS. 15–18, which were described above, indicate that at low additional silicon content, silicon-rich $Si_3N_4$ films function as a charge storing medium as they exhibit appreciably enhanced trapping characteristics (as shown by the high flatband shifts at moderate and high applied electric fields in FIGS. 17 and 18, respectively) without exhibiting appreciably enhanced conductivity characteristics as shown in FIG. 15.

Silicon-rich silicon nitride films deposited at an R of 3 or 5 (for a refractive index of 2.10 and 2.17, respectively) will possess a charge storing function or property normally provided by a polysilicon floating gate of a EEPROM cell. In general, silicon-rich nitride films having an R greater than 0.1 and less than 10 (or, more specifically, having an index of refraction between approximately 2.10 and 2.30) will provide appreciably enhanced charge trapping or charge storing properties without providing appreciably enhanced charge conduction. This charge trapping is characteristic of a charge storing medium that can be used as a charge trapping material in the present subject matter.

Silicon-rich nitride films having an R greater than 10 (or, more specifically, having an index of refraction greater than 2.3) are referred to as an injector medium. A silicon-rich $Si_3N_4$ (SRN) injector provides appreciably enhanced charge conductance without providing appreciably enhanced charge trapping over stoichiometric $Si_3N_4$. This is illustrated in FIGS. 17 and 18, which shows progressively reduced flatband shifts for R=10 and R=15 with progressively increased conduction.

Figure 19:
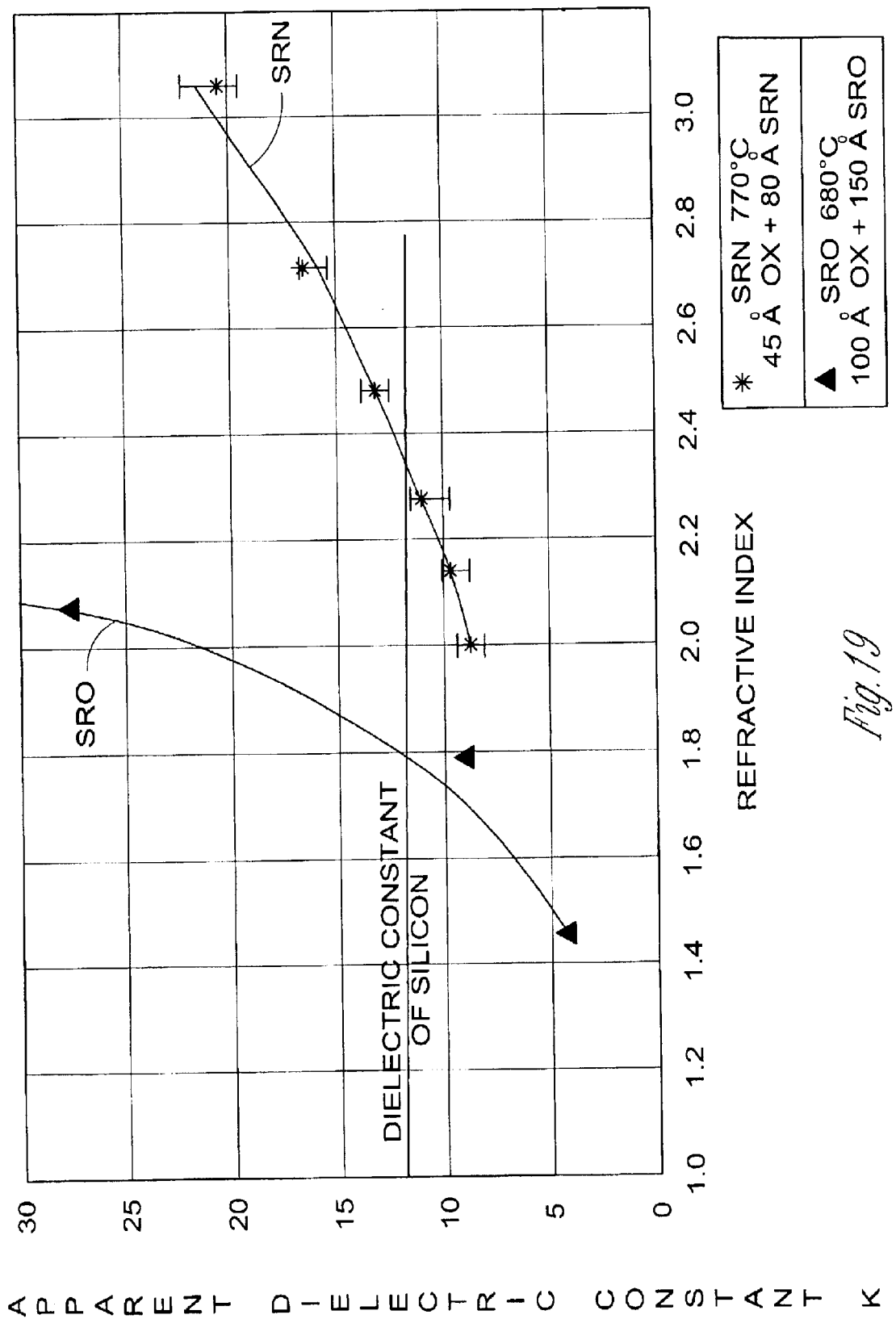
FIG. 19 is a graph showing apparent dielectric constant K versus refractive index for both Silicon Rich Nitride (SRN) and Silicon Rich Oxide (SRO).

FIG. 19 is a graph showing apparent dielectric constant K versus refractive index for both Silicon Rich Nitride (SRN) and Silicon Rich Oxide (SRO). The SRN and SRO plotted in this graph were provided using a Low Pressure Chemical Vapor Deposition (LPCVD) process. The SRO was fabricated at approximately 680° C., and the fabricated structure included 100 Å oxide and 150 Å SRO. The SRN was fabricated at approximately 770° C., and the fabricated structure included 45 Å oxide and 80 Å SRN. As shown in the graph, the dielectric constant of silicon is around 12. Materials with a higher K than silicon are conventionally termed a high K material, and materials with a lower K than silicon are conventionally termed a low K material. SRN that has a refractive index of 2.5 or greater and SRO that has a refractive index of 1.85 or greater have apparent dielectric constants that are greater than 12. Injector SRI includes these high K SRO and high K SRN. Charge-centered SRI includes low K SRO and low K SRN.

Memory Cell Fabrication Using Charge Trapping SRI Layer

The processing of the memory cell of the present subject matter involves standard processing associated with PD-SOI device fabrication. The channel implant is adjusted to appropriately tailor the FET threshold. According to various embodiments, the BOX-body interface includes a trapping layer, such as an SRI layer.

Various embodiments create the trapping layer using the following process. Standard processing steps are performed through the shallow trench isolation (STI). A block mask is applied to device and open the active retention of the FET device. In these embodiments, the FET device is an NFET device, but the present subject matter is not limited to NFET devices. Silicon, ammonia ($NH_3$), and optionally hydrogen are ion implanted with an appropriate energy and concentration to achieve a desired refractive index after post processing anneal. In various embodiments, ammonia is replaced by active nitrogen. In various embodiments silicon is replaced by other active silicon sources such as silane, dichlorosilane, and the like. A post-implant inert anneal is performed. According to various embodiments, the anneal includes a rapid thermal anneal (RTA). According to various embodiments, the anneal includes an inert plasma anneal in nitrogen. Standard PD-SOI CMOS fabrication steps are capable of being performed thereafter to complete the fabrication of the memory cell.

Other Charge Trapping Layers

Although SRI layers are specifically cited as "charge trapping layers," many other charge trapping materials are used as a charge trapping medium in many other embodiments. For example, transition-metal-oxides, metal silicides and composites or laminates can be used to form charge trapping layers. Nano-voids also can be used to form charge trapping layers. These examples are not intended to be an exhaustive list of the number of ways to form charge trapping layers that can be used according to the present subject matter. One of ordinary skill in the art will understand that such layers are incorporated by appropriate fabrication processes.

Conclusion

The present subject matter relates to non-volatile SOI memory cells. The present subject matter exploits the floating body effect associated with SOI-FET devices. The memory cell includes charge trapping regions in the body region of a SOI-FET device. Charges generated by the floating body effect are stored in the charge trapping regions to provide a first memory state, and the stored charges are neutralized to provide a second memory state. The threshold voltage of the SOI-FET is affected by the stored charges. Thus the channel conductance is capable of being used to determine the state of the memory cell.

The present subject matter is capable of providing non-volatile memories. Memories according to the present subject matter are capable of maintaining data integrity for up to ten years without refresh. Additionally, the present subject matter is capable of providing non-volatile memories that can be written using the power supply voltage. Thus, the present subject matter does not require the complicated circuitry to generate and deliver 4 to 8 times the power supply voltage such as is required by Flash, EEPROM and the like. Additionally, the present subject matter is capable of providing memories with an effectively unlimited number of write-erase cycles during the system lifetime ($10^{13}$ to $10^{14}$ write-erase cycles in 10 years). Additionally, the present subject matter is capable of providing memories that have fast read and write operations on the order of nanoseconds rather than milliseconds. Additionally, the present subject matter is capable of providing dense memories ($4F^2$).

Previously, a specific memory type (DRAM, SRAM, ROM, Flash, and the like) was used in specific applications to provide the desired memory characteristics for the specific applications. One of ordinary skill in the art will appreciate, upon reading and comprehending this disclosure, that in view of the above-identified capabilities in a single memory type, the present subject matter is capable of providing the desirable memory characteristics for an wide range of applications. Thus, the memory for systems that have a number of specific memory applications can be economically fabricated according to the present subject matter.

This disclosure includes several processes, circuit diagrams, and cell structures. The present subject matter is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations of the present subject matter. It is to be understood that the above description is intended to be illustrative, and not restrictive. Combinations of the above embodiments, and other embodiments, will be apparent to those of skill in the art upon reviewing the above description. The scope of the present subject matter should be determined with reference to the appended claims, along with the full scope of equivalents to which such claims are entitled.

What is claimed is:

1. A silicon-on-insulator field effect transistor (SOI-FET), comprising:

a body region formed over a substrate with a buried insulator layer disposed between the body region and the substrate, wherein the body region includes a charge trapping region;

a first diffusion region and a second diffusion region to provide a channel region in the body region between the first diffusion region and the second diffusion region;

a gate insulator layer formed over the channel region; and a gate formed over the gate insulator layer.

2. The SOI-FET of claim 1, wherein the SOI-FET has a first threshold voltage associated with a non-volatile first memory state when excess charges are trapped in the charge trapping region, and a second threshold voltage associated with a second memory state when trapped charges in the charge trapping region are neutralized.

3. The SOI-FET of claim 1, wherein the charge trapping region is located in the body region proximate to an interface between the body region and the buried insulator layer.

4. The SOI-FET of claim 1, wherein the charge trapping region includes a charge trapping layer located in the body region at a depth of at least 200 Å from a top surface of the body region.

5. The SOI-FET of claim 1, wherein the charge trapping region includes a silicon-rich-insulator (SRI) layer located in the body region proximate to an interface between the body region and the buried insulator layer.

6. The SOI-FET of claim 1, wherein the charge trapping region includes a silicon-rich-nitride (SRN) layer located in the body region proximate to an interface between the body region and the buried insulator layer.

7. The SOI-FET of claim 1, wherein a potential difference is applied between the gate and the substrate to direct excess charges towards the charge trapping region.

8. The SOI-FET of claim 1, wherein the charge trapping region is capable of storing charges for a length of time to provide the SOI-FET with non-volatility.

9. The SOI-FET of claim 1, wherein the charge trapping region is capable of storing charges for a length of time to provide the SOI-FET with data integrity for up to ten years without refresh.

10. The SOI-FET of claim 1, wherein the charge trapping region is capable of trapping charges and is capable of de-trapping/neutralizing charges such that the SOI-FET has fast read and write operations on the order of nanoseconds.

11. The SOI-FET of claim 1, wherein the charge trapping region is capable of trapping charges and is capable of de-trapping/neutralizing charges such that the SOI-FET is capable of performing read and write operations using voltage pulses no greater in magnitude than a power supply voltage.

12. The SOI-FET of claim 1, wherein the SOI-FET has a cell size of $4F^2$.

13. The SOI-FET of claim 1, wherein a channel conductance of the SOI-FET is used to determine whether the SOI-FET is in the first memory state or the second memory state.

14. The SOI-FET of claim 13, wherein the channel conductance is determined using a source current of the SOI-FET.

15. A silicon-on-insulator field effect transistor (SOI-FET), comprising:
- a body region formed over a substrate with a buried insulator layer disposed between the body region and the substrate, wherein the body region includes a charge trapping region;
- a first diffusion region and a second diffusion region to provide a channel region in the body region between the first diffusion region and the second diffusion region;
- a gate insulator layer formed over the channel region; and
- a gate formed over the gate insulator layer,
wherein:
- the charge trapping region is capable of storing charges for a length of time to provide the SOI-FET with non-volatile data integrity for up to ten years without refresh;
- the charge trapping region is capable of trapping charges and is capable of de-trapping/neutralizing charges such that the SOI-FET has fast read and write operations on the order of nanoseconds, and such that the SOI-FET is capable of performing read and write operations using voltage pulses no greater in magnitude than a power supply voltage; and
- the SOI-FET has a cell size of $4F^2$.

16. A silicon-on-insulator field effect transistor (SOI-FET), comprising:
- a body region formed over a substrate with a buried insulator layer disposed between the body region and the substrate, wherein the body region includes a silicon-rich-insulator (SRI) layer;
- a first diffusion region and a second diffusion region to provide a channel region in the body region between the first diffusion region and the second diffusion region;
- a gate insulator layer formed over the channel region; and
- a gate formed over the gate insulator layer,
wherein the SOI-FET has a first threshold voltage associated with a non-volatile first memory state when excess charges are trapped in the SRI layer, and a second threshold voltage associated with a second memory state when trapped charges in the SRI layer are neutralized.

17. The SOI-FET of claim 16, wherein the SRI layer includes a silicon-rich-nitride (SRN) layer.

18. The SOI-FET of claim 16, wherein the SRI layer includes a silicon-rich-oxide (SRO) layer.

19. The SOI-FET of claim 16, wherein:
- the body region is doped with p-type impurities;
- both the first diffusion region and the second diffusion region are doped with n+ diffusion regions; and
- a number of excess holes generated in the body region are trapped in the SRI layer.

20. The SOI-FET of claim 16, wherein:
- the body region is doped with n-type impurities;
- both the first diffusion region and the second diffusion region are doped with p+ diffusion regions; and
- a number of excess electrons generated in the body region are trapped in the SRI layer.

21. The SOI-FET of claim 16, wherein a potential difference is applied between the gate and the substrate to provide a charge drift toward the SRI layer.

22. The SOI-FET of claim 16, wherein the charge to be trapped in the SRI layer is generated by impact ionization in a field effect transistor (FET) mode of operation.

23. The SOI-FET of claim 16, wherein the charge to be trapped in the SRI layer is generated in a lateral parasitic bipolar junction transistor (BJT) mode of operation.

24. A memory cell, comprising:
- a substrate;
- a buried insulator layer formed on the substrate; and
- a transistor formed on the buried insulator layer, including:
  - a floating body region, including a charge trapping region within the floating body region;
  - a first diffusion region and a second diffusion region to provide a channel region in the body region between the first diffusion region and the second diffusion region;
  - a gate insulator layer formed over the channel region; and
  - a gate formed over the gate insulator layer.

25. The memory cell of claim 24, wherein the charge trapping region is located in the body region proximate to an interface between the body region and the buried insulator layer.

26. The memory cell of claim 24, wherein the charge trapping region is at a depth of at least 200 Å from a top surface of the body region.

27. The memory cell of claim 24, wherein the charge trapping region includes a silicon-rich-insulator (SRI) layer located in the body region proximate to an interface between the body region and the buried insulator layer.

28. The memory cell of claim 24, wherein the charge trapping region includes a silicon-rich-nitride (SRN) layer located in the body region proximate to an interface between the body region and the buried insulator layer.

29. The memory cell of claim 24, further comprising a substrate contact to apply a substrate voltage and produce an electromotive force (EMF) field across the floating body region to direct excess charges to the charge trapping region.

30. A memory cell, comprising:
- a substrate;
- a buried oxide (BOX) insulator layer formed on the substrate; and
- a silicon-on-insulator field effect transistor (SOI-FET) formed on the BOX insulator layer, including:
  - a floating body region, including a silicon-rich-insulator (SRI) layer within the floating body region;
  - a first diffusion region and a second diffusion region to provide a channel region in the body region between the first diffusion region and the second diffusion region;

a gate insulator layer formed over the channel region; and a gate formed over the gate insulator layer.

31. The memory cell of claim 30, wherein the SRI layer is located in the body region proximate to an interface between the body region and the BOX insulator layer.

32. The memory cell of claim 30, wherein the SRI layer includes a silicon-rich-nitride (SRN) layer.

33. The memory cell of claim 30, wherein the SRI layer includes a silicon-rich-oxide (SRO) layer.

34. A memory cell, comprising:
 a substrate having a substrate contact to apply a substrate voltage;
 a buried oxide (BOX) insulator layer formed on the substrate; and
 a silicon-on-insulator field effect transistor (SOI-FET) formed on the BOX insulator layer, including:
  a floating body region, including a silicon-rich-insulator (SRI) layer within the floating body region;
  a first diffusion region and a second diffusion region to provide a channel region in the body region between the first diffusion region and the second diffusion region, the first diffusion region having a drain contact to apply a drain voltage, and the second diffusion region having a source contact;
  a gate insulator layer formed over the channel region; and
  a gate formed over the gate insulator layer, the gate having a gate contact to apply a gate voltage.

35. The memory cell of claim 34, wherein operation of the SOI-FET generates a charge in the floating body region, and an electro-motive force (EMF) field is applied between the substrate and the gate to direct the charge to the SRI layer.

36. The memory cell of claim 34, wherein the charge is generated in the floating body region due to impact ionization when the SOI-FET is operated in a field effect transistor (FET) mode of operation.

37. The memory cell of claim 34, wherein the charge is generated in the floating body region when the SOI-FET is operated in a lateral parasitic bipolar junction transistor (BJT) mode of operation.

38. The memory cell of claim 34, wherein:
 a first non-volatile memory state is associated with a first threshold voltage;
 a second memory state is associated with a second threshold voltage;
 the SRI layer is adapted to hold trapped charges in the body region to provide the first threshold voltage; and
 the trapped charges are neutralized to provide the second threshold voltage.

39. The memory cell of claim 38, wherein a current through the source contact is used to determine whether the memory cell is in one of the first memory state and the second memory state.

40. A memory cell, comprising:
 a substrate;
 a buried insulator layer formed on the substrate; and
 a transistor formed on the insulator layer, including:
  means to trap excess charges in a floating body of the transistor;
  means to generate excess charges to be trapped in the floating body to provide a first memory state; and
  means to neutralize trapped charges in the floating body to provide a second memory state.

41. The memory cell of claim 40, wherein means to trap excess charges in a floating body of the transistor includes a charge trapping layer formed in the floating body of the transistor.

42. The memory cell of claim 40, wherein means to generate excess charges to be trapped in the floating body includes operating the transistor in a saturated mode such that charges are generated through impact ionization.

43. The memory cell of claim 40, wherein means to generate charges to be trapped in the floating body includes creating charges in the floating body using a lateral parasitic bipolar junction transistor.

44. The memory cell of claim 40, wherein means to neutralize trapped charges in the floating body includes means to forward bias a diode between the floating body and a diffusion region of the transistor.

45. The memory cell of claim 40, wherein means to trap excess charges in a floating body of the transistor includes a silicon-rich-insulator (SRI) layer formed in the floating body of the transistor.

46. The memory cell of claim 45, wherein the SRI layer includes a silicon-rich-nitride (SRN) layer.

47. A memory device, comprising:
 a memory array, including:
  a substrate;
  a buried insulator layer formed on the substrate; and
  a number of memory cells formed on the buried insulator layer and organized in a number of rows and a number of columns, each of the number of memory cells including a transistor formed on the buried insulator layer, the transistor including a floating body region that includes a charge trapping region, the transistor further including a first diffusion region and a second diffusion region to provide a channel region in the body region between the first diffusion region and the second diffusion region, a gate insulator layer formed over the channel region, and a gate formed over the gate insulator layer; and
 control circuitry operably connected to the memory array to write selected memory cells and to read selected memory cells.

48. The memory device of claim 47, wherein the charge trapping region includes a silicon-rich-insulator (SRI) layer located in the floating body region near an interface between the floating body region and the buried insulator layer.

49. The memory device of claim 47, wherein:
 the control circuitry includes word line select and power circuitry to provide a desired voltage pulse to a word line for a selected row of memory cells; and
 the word line is connected to the gate for each memory cell in the row of memory cells.

50. The memory device of claim 47, wherein:
 the control circuitry includes bit line select and power circuitry to provide a desired voltage pulse to a bit line for a selected column of memory cells; and
 the bit line is connected to the first diffusion region for each memory cell in the column of memory cells.

51. The memory device of claim 47, wherein, for a selected memory cell, the control circuitry includes circuitry to provide a desired word voltage pulse to the gate of the selected memory cell, a desired bit voltage pulse to the first diffusion region of the selected memory cell, and a desired substrate voltage pulse to the substrate of the selected memory cell.

52. The memory device of claim 47, wherein the control circuitry includes read circuitry to use a source current for a selected memory cell to determine the state of the selected memory cell.

53. The memory device of claim 47, wherein the control circuitry includes substrate control circuitry to provide a desired voltage pulse to the substrate.

54. The memory device of claim 53, wherein:

the memory array includes more than one substrate region; and the substrate control circuitry is adapted to provide a desired voltage pulse to a selected substrate region.

55. A memory device, comprising:

a memory array, including:

a substrate;

a buried insulator layer formed on the substrate; and a number of one-transistor memory cells formed on the buried insulator layer and organized in a number of rows and a number of columns, each of the number of memory cells including one transistor formed on the buried insulator layer, the transistor including a floating body region that includes a silicon-rich-insulator (SRI) layer, the transistor further including a first diffusion region and a second diffusion region to provide a channel region in the body region between the first diffusion region and the second diffusion region, a gate insulator layer formed over the channel region, and a gate formed over the gate insulator layer; and control circuitry operably connected to the memory array to write selected memory cells and to read selected memory cells.

56. The memory device of claim 55, wherein the SRI layer is located in the floating body region near an interface between the floating body region and the buried insulator layer.

57. The memory device of claim 55, wherein the control circuitry includes circuitry to write to a selected cell by providing a desired voltage pulse to the gate of the selected memory cell, a desired voltage pulse to the first diffusion region of the selected memory cell, and a desired voltage pulse to the substrate.

58. The memory device of claim 55, wherein the control circuitry includes circuitry to read a selected cell by providing a desired voltage to the gate of the selected memory cell, a desired voltage to the first diffusion region of the selected memory cell, and a desired voltage pulse to the substrate, and by using a source current of the transistor to determine a memory state of the memory cell.

59. An electronic system, comprising:

a processor; and at least one memory cell to communicate with the processor, the memory cell including a silicon-on-insulator field effect transistor (SOI-FET), including:

a body region formed over a substrate with a buried insulator layer disposed between the body region and the substrate, wherein the body region includes a charge trapping region;

a first diffusion region and a second diffusion region to provide a channel region in the body region between the first diffusion region and the second diffusion region;

a gate insulator layer formed over the channel region; and a gate formed over the gate insulator layer, wherein the SOI-FET has a first threshold voltage associated with a first memory state, and a first threshold voltage associated with a non-volatile first memory state when excess charges are trapped in the charge trapping region, and a second threshold voltage associated with a second memory state when trapped charges in the charge trapping region are neutralized.

60. The system of claim 59, wherein the charge trapping region is located in the body region proximate to an interface between the body region and the buried insulator layer.

61. The system of claim 59, wherein the charge trapping region is at a depth of at least 200 Å from a top surface of the body region.

62. The system of claim 59, wherein the charge trapping region includes a silicon-rich-insulator (SRI) layer located in the body region proximate to an interface between the body region and the buried insulator layer.

63. The system of claim 59, wherein the charge trapping region includes a silicon-rich-nitride (SRN) layer located in the body region proximate to an interface between the body region and the buried insulator layer.

64. A method of forming a non-volatile memory cell, comprising:

providing a substrate;

forming a buried oxide (BOX) insulator on the substrate; and forming a silicon-on-insulator field effect transistor (SOI-FET) over the BOX insulator, including forming a charge trapping region in a body region of the SOI-FET.

65. The method of claim 64, wherein forming a charge trapping region includes forming a silicon-rich-nitride (SRN) layer.

66. The method of claim 64, wherein forming a charge trapping region includes:

ion implanting silicon and ammonia ($NH_3$) into the body region using a predetermined energy and concentration to achieve a desired refractive index; and performing a post-implant inert anneal of the body region.

67. The method of claim 64, wherein forming a charge trapping region includes:

ion implanting an active silicon source with an active nitrogen into the body region using a predetermined energy and concentration to achieve a desired refractive index; and performing a post-implant inert anneal of the body region.

68. The method of claim 64, further comprising forming a substrate contact to provide a substrate voltage pulse to the substrate, a gate line contact to provide a gate voltage pulse to a gate of the SOI-FET, a bit line contact to provide a bit line voltage pulse to a first diffusion region of the SOI-FET, and a source line contact.

* * * * *

UNITED STATES PATENT AND TRADEMARK OFFICE
CERTIFICATE OF CORRECTION

PATENT NO. : 6,917,078 B2
DATED : July 12, 2005
INVENTOR(S) : Bhattacharyya

It is certified that error appears in the above-identified patent and that said Letters Patent is hereby corrected as shown below:

Title page,
Item [56], References Cited, U.S. PATENT DOCUMENTS, delete "Cho" and insert -- Cho et al. --, therefor.

Column 10,
Line 50, delete "(FIG. 1B)" and insert -- (FIG. 11B) --, therefor.

Signed and Sealed this

Twenty-second Day of November, 2005

JON W. DUDAS
*Director of the United States Patent and Trademark Office*